(12) United States Patent
Hayashi

(10) Patent No.: US 8,853,852 B2
(45) Date of Patent: Oct. 7, 2014

(54) SEMICONDUCTOR APPARATUS AND ELECTRONIC EQUIPMENT

(71) Applicant: Sony Corporation, Tokyo (JP)

(72) Inventor: Toshihiko Hayashi, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/671,130

(22) Filed: Nov. 7, 2012

(65) Prior Publication Data

US 2013/0134576 A1  May 30, 2013

(30) Foreign Application Priority Data

Nov. 30, 2011 (JP) ................. 2011-261331

(51) Int. Cl.
*H01L 21/02* (2006.01)
(52) U.S. Cl.
CPC ............. *H01L 21/02697* (2013.01)
USPC ........... 257/734; 257/E27.13; 257/E31.097; 257/447; 438/597
(58) Field of Classification Search
USPC ............ 257/734, E27.13, E31.097, 447; 438/597
See application file for complete search history.

(56) References Cited

U.S. PATENT DOCUMENTS

2010/0238331 A1* 9/2010 Umebayashi et al. ........ 348/294

FOREIGN PATENT DOCUMENTS

JP      2010-245506       10/2010

* cited by examiner

*Primary Examiner* — Alexander Oscar Williams
(74) *Attorney, Agent, or Firm* — Sheridan Ross P.C.

(57) ABSTRACT

A method for manufacturing the semiconductor apparatus includes an anchor process of forming a barrier metal film and carrying out physical etching making use of sputter gas. The anchor process is carried out at the same time on a wire connected to the lower portion of a first aperture serving as a penetration connection hole and a wire connected to the lower portion of a second aperture serving as a connection hole having an aspect ratio different from the aspect ratio of the penetration connection hole. The first and second apertures are apertures created on a semiconductor substrate obtained by bonding first and second semiconductor substrates to each other. The present technology can be applied to the semiconductor apparatus such as a solid-state imaging apparatus.

6 Claims, 28 Drawing Sheets

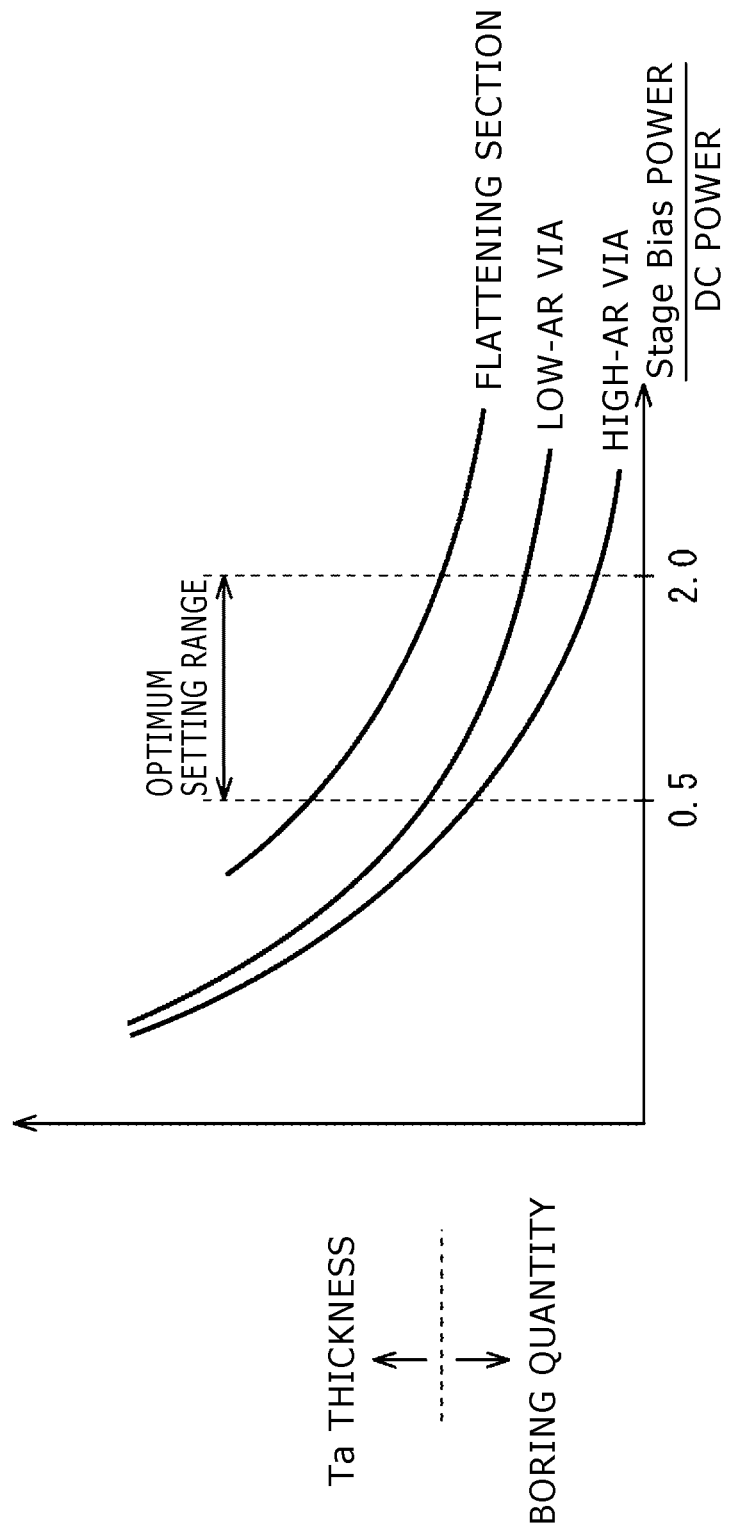

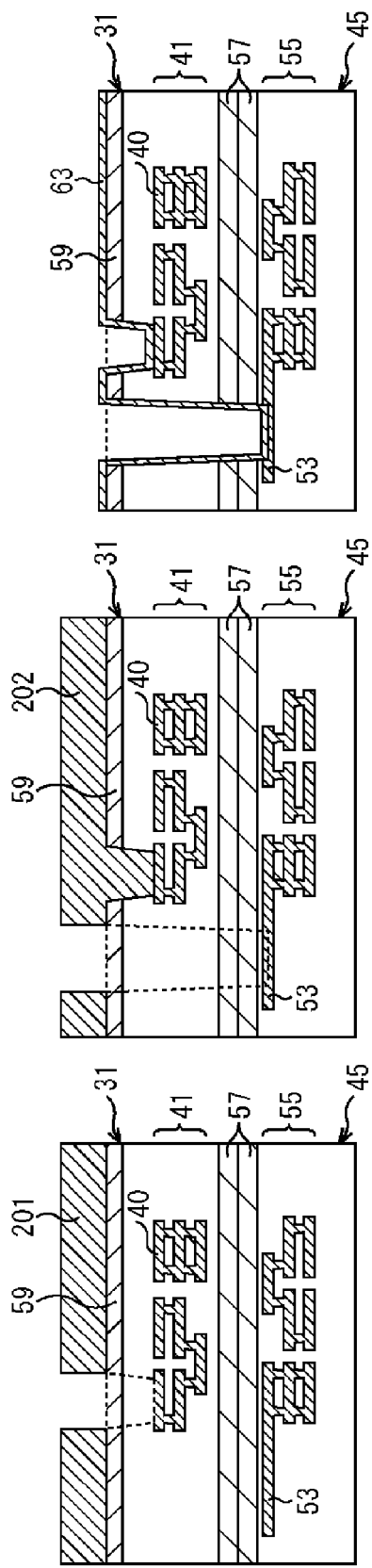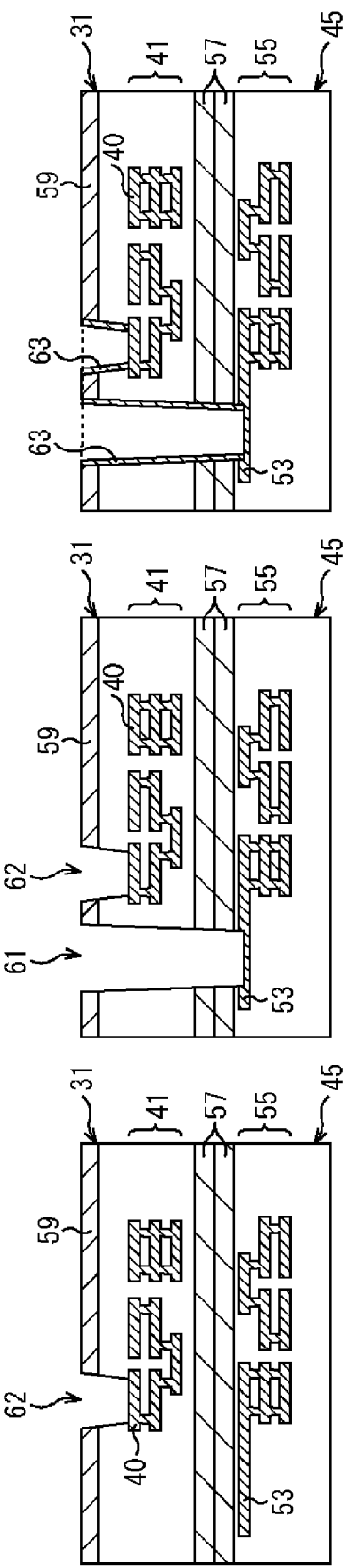

SEMICONDUCTOR APPARATUS AND ELECTRONIC EQUIPMENT

BACKGROUND

The present technology relates to a semiconductor apparatus, a method for manufacturing the semiconductor apparatus and electronic equipment employing the semiconductor apparatus. More particularly, the present technology relates to a semiconductor apparatus making it possible to carry out processing optimum for wires connected to lower portions of a plurality of apertures having aspect ratios different from each other, relates to a method for manufacturing the semiconductor apparatus and relates to electronic equipment employing the semiconductor apparatus.

An amplification-type solid-state imaging apparatus is known as one of solid-state imaging apparatus. A representative example of the amplification-type solid-state imaging apparatus is a CMOS (Complementary Metal Oxide Semiconductor) image sensor. In addition, a charge-transfer solid-state imaging apparatus is also known. A representative example of the charge-transfer solid-state imaging apparatus is a CCD (Charge Couple Device) image sensor. These solid-state imaging apparatus are widely used in electronic equipment such as a digital still camera and a digital video camera. In recent years, in a number of mobile equipment such as a mobile phone having a camera embedded therein and a PDA (Personal Digital Assistant), CMOS image sensors or MOS solid-state imaging apparatus are used to serve as solid-state imaging apparatus because these CMOS image sensors or these MOS solid-state imaging apparatus offer merits such as a low power-supply voltage and a small power consumption.

The MOS solid-state imaging apparatus is configured to include a pixel area and a peripheral-circuit area surrounding the pixel area. The pixel area includes a plurality of unit pixels laid out to form a two-dimensional array. Each of the pixel units is configured to include a photodiode serving as an opto-electrical conversion section and a plurality of pixel transistors. The pixel transistors are each a MOS transistor. Typically, the unit pixel employs three pixel transistors. The three pixel transistors are a transfer transistor, a reset transistor and an amplification transistor. In some cases, the unit pixel employs four pixel transistors including a select transistor in addition to the transfer transistor, the reset transistor and the amplification transistor.

There have been proposed a variety of such MOS solid-state imaging apparatus each configured to serve as a device including a first semiconductor substrate and a second semiconductor substrate which are electrically connected to each other. In the first semiconductor substrate, a pixel area including a plurality of pixels is created. In the second semiconductor substrate, on the other hand, logic circuits for processing signals are created. For example, inventors of the present technology have proposed a semiconductor apparatus disclosed in Japanese Patent Laid-open No. 2010-245506. The proposed semiconductor apparatus has a configuration in which a first semiconductor substrate and a second semiconductor substrate are pasted on each other to provide a small thickness or to form a thin film and electrically connected to each other.

SUMMARY

In the semiconductor apparatus having a configuration in which two semiconductor substrates are pasted on each other and electrically connected to each other as described above, there are a plurality of connection holes having aspect ratios different from each other. Typically, the connection holes include a deep hole passing through both the semiconductor substrates pasted on each other and a shallow hole passing through only one of the two semiconductor substrates.

If processing such as an etching process must be carried out on the connection holes having aspect ratios different from each other at the same time, the optimum amount of the processing needs to be set to vary from hole to hole due to the different aspect ratios. Thus, there is raised a problem that it is impossible to carry out processing optimum for the deep and shallow connection holes.

In view of foregoing, the present technology addresses to provide a capability of carrying out processing optimum for each of wires connected to the lower portions of a plurality of apertures having aspect ratios different from each other.

In accordance with a first mode of the present technology, there is provided a method for manufacturing a semiconductor apparatus. The method includes a first process of forming a barrier metal film and carrying out physical etching making use of sputter gas. The first process is carried out at the same time on wires connected to lower portions of first and second apertures created on a semiconductor substrate obtained by bonding first and second semiconductor substrates to each other. The first and second apertures have aspect ratios different from each other.

A semiconductor apparatus according a second mode of the present technology is manufactured by adoption of a manufacturing method including a process of forming a barrier metal film and carrying out physical etching making use of sputter gas. The process is carried out at the same time on wires connected to lower portions of first and second apertures created on a semiconductor substrate obtained by bonding first and second semiconductor substrates to each other. The first and second apertures have aspect ratios different from each other.

Electronic equipment according a third mode of the present technology is provided with a semiconductor apparatus manufactured by adoption of a manufacturing method including a process of forming a barrier metal film and carrying out physical etching making use of sputter gas. The process is carried out at the same time on wires connected to lower portions of first and second apertures created on a semiconductor substrate obtained by bonding first and second semiconductor substrates to each other. The first and second apertures have aspect ratios different from each other.

In accordance with the first to third modes of the present technology, a process is performed to form a barrier metal film and carry out physical etching making use of sputter gas at the same time on wires connected to lower portions of first and second apertures created on a semiconductor substrate obtained by bonding first and second semiconductor substrates to each other in the semiconductor apparatus. The first and second apertures have aspect ratios different from each other.

The semiconductor apparatus serving as a solid-state imaging apparatus can be an independent apparatus or an internal block of electronic equipment.

In accordance with the first to third modes of the present technology, it is possible to carry out processing optimum for wires connected to lower portions of a plurality of apertures having aspect ratios different from each other.

BRIEF DESCRIPTION OF THE DRAWINGS

FIG. 18 is a diagram to be referred to in description of typical concrete set values of the anchor processing;

FIGS. 20A to 20F are explanatory diagrams to be referred to in detailed description of a step S1 of the flowchart shown in FIG. 15;

DETAILED DESCRIPTION OF THE PREFERRED EMBODIMENTS

Figure 1:
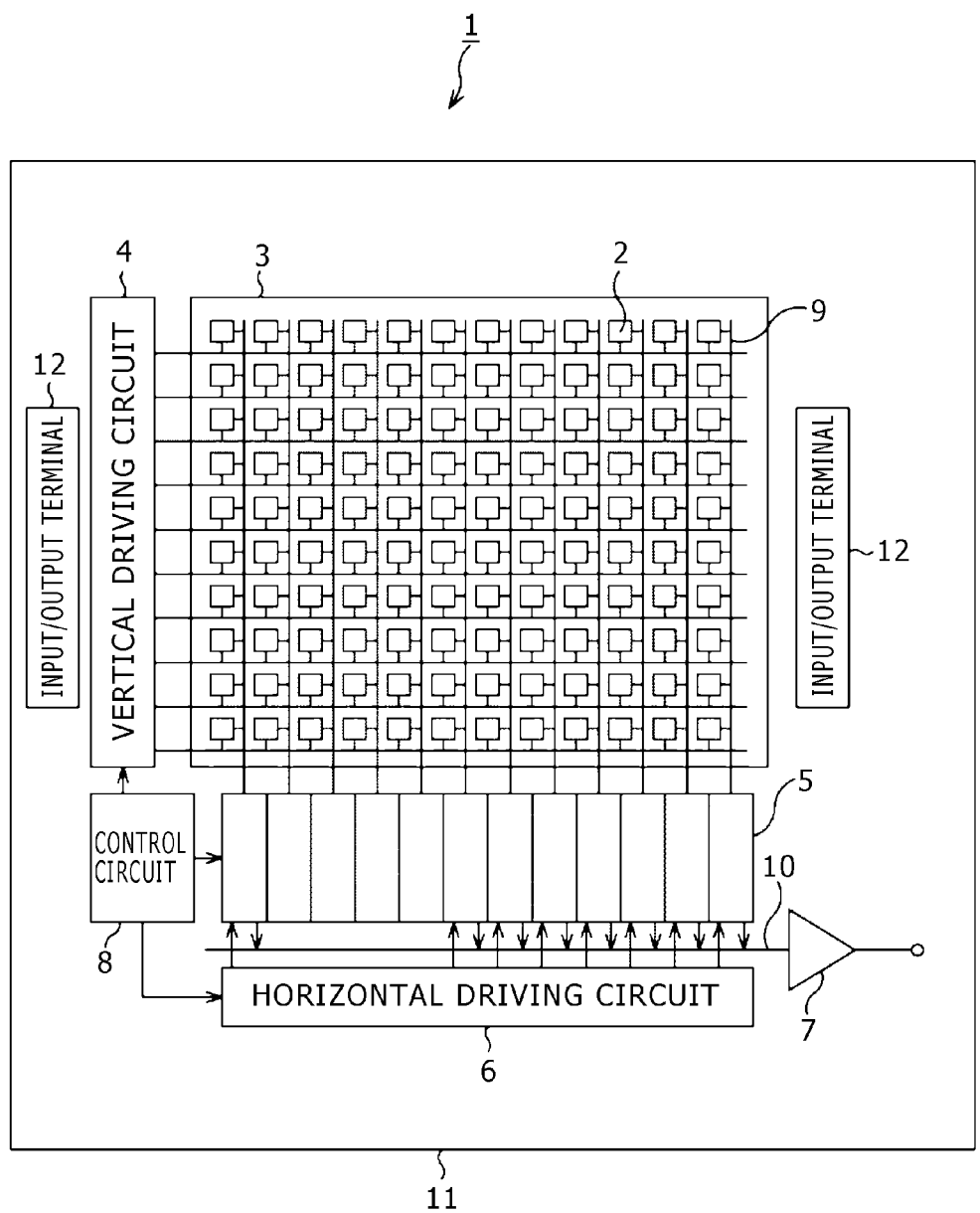
FIG. 1 is a diagram showing an outline configuration of a solid-state imaging apparatus according to one form of the present technology.

Embodiments of the present technology are described below. In the following description, the embodiments of the present technology are referred to simply as embodiments. It is to be noted that the description is divided into topics arranged as follows:

1: Outlines of Methods for Configuring and Manufacturing Solid-State Imaging Apparatus 2: Detailed Processes of Embedding Penetration Connection Conductors and Connection Conductors 1: Outlines of Methods for Configuring and Manufacturing Solid-State Imaging Apparatus Typical Outline Configuration of the Solid-State Imaging Apparatus FIG. 1 is a diagram showing an outline configuration of a solid-state imaging apparatus 1 serving as an example of a semiconductor apparatus applied with the present technology. The solid-state imaging apparatus 1 shown in FIG. 1 is a MOS solid-state imaging apparatus of the rear radiation type.

The solid-state imaging apparatus 1 shown in FIG. 1 is configured to include typically a pixel area 3 and a peripheral-circuit section surrounding the pixel area 3. The pixel area 3 and the peripheral-circuit section are provided on a semiconductor substrate 11 such as a silicon substrate. The pixel area 3 includes a plurality of pixels 2 laid out regularly to form a two-dimensional array. Each of the pixels 2 typically has an opto-electrical conversion section. The peripheral-circuit section includes a vertical driving circuit 4, a column-signal processing circuit 5, a horizontal driving circuit 6, an output circuit 7 and a control circuit 8.

The opto-electrical conversion section employed in the pixel 2 is typically a photodiode. In addition to the opto-electrical conversion section, the pixel 2 also includes a plurality of pixel transistors which are each the so-called MOS transistor. Typically, the pixel 2 employs three pixel transistors. The three pixel transistors are a transfer transistor, a reset transistor and an amplification transistor. In some cases, the pixel 2 employs four pixel transistors including a select transistor in addition to the transfer transistor, the reset transistor and the amplification transistor.

A pixel 2 can be configured to form a unit pixel. Since an equivalent circuit of the unit pixel is identical with the ordinary equivalent circuit, detailed explanation of the pixel 2 is omitted. In addition, the pixel 2 can also be configured to have a shared pixel structure. The shared pixel structure is configured to include a plurality of photodiodes, a plurality of transfer transistors, a shared floating diffusion and each of the other pixel transistors sharing the floating diffusion. That is to say, the shared pixel structure is constructed into a configuration in which a plurality of photodiodes each included in a unit pixel and a plurality of transfer transistors each included in a unit pixel are shared by each of other pixel transistors.

The control circuit 8 receives an input clock signal and data specifying an operation mode and the like. In addition, the control circuit 8 outputs data such as internal information on the solid-state imaging apparatus 1. That is to say, on the basis of a vertical synchronization signal, a horizontal synchronization signal and a master clock signal, the control circuit 8 generates control signals and clock signals serving as references of operations carried out by circuits such as the vertical driving circuit 4, the column-signal processing circuit 5 and the horizontal driving circuit 6. Then, the control circuit 8 supplies the clock and control signals generated thereby to the circuits such as the vertical driving circuit 4, the column-signal processing circuit 5 and the horizontal driving circuit 6.

The vertical driving circuit 4 is configured from typically a shift register for selecting a pixel driving line and supplying pulses to the selected pixel driving line in order to drive pixels 2 connected to the pixel driving line. In this way, the vertical driving circuit 4 drives pixels in row units. That is to say, the vertical driving circuit 4 sequentially scans and selects pixels 2 in the pixel area 3 in the vertical direction in row units. The pixel 2 generates a pixel signal based on signal electric charge generated in accordance with the quantity of light received by the photodiode serving as the opto-electrical conversion section of the pixel 2. Then, the selected pixel 2 supplies the pixel signal generated thereby to the column-signal processing circuit 5 through a vertical signal line 9.

The column-signal processing circuit 5 is provided typically for every column of pixels 2. The column-signal processing circuit 5 carries out signal processing such as elimination of noises on signals output from pixels 2 provided on a row for each column. To be more specific, the signal processing carried out by the column-signal processing circuit 5 includes CDS (Correlated Double Sampling) for eliminating fixed pattern noises inherent to the pixel 2, signal amplification and AD (analog-to-digital) conversion.

The horizontal driving circuit 6 is configured from typically a shift register for outputting horizontal scan pulses sequentially in order to select a column-signal processing circuits 5 one after another. The sequentially selected column-signal processing circuit 5 outputs a pixel signal to a horizontal signal line 10.

The output circuit 7 carries out signal processing on signals supplied sequentially from the column-signal processing circuits 5 through the horizontal signal line 10, and outputs the processed signals. The output circuit 7 may typically carry out only buffering in some cases. In other cases, the signal processing carried out by the output circuit 7 may include black-level adjustment, column-variation correction and various kinds of digital-signal processing. An input/output terminal 12 exchanges signals with external elements.

Next, the configuration of the substrates employed in the solid-state imaging apparatus 1 shown in FIG. 1 is explained by referring to FIGS. 2A to 2C as follows.

Figure 2A:
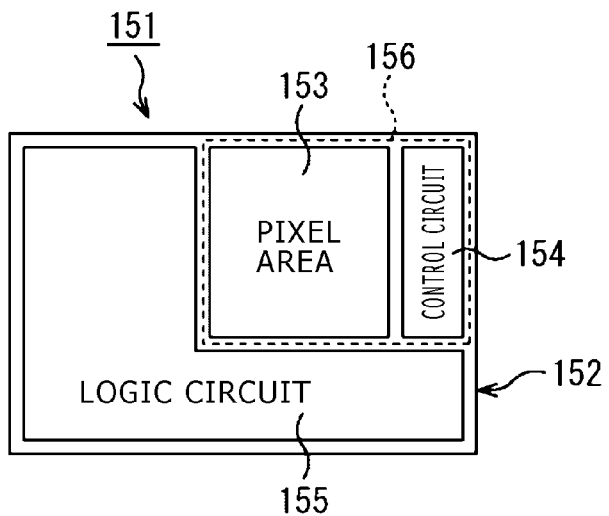
FIGS. 2A to 2C are explanatory diagrams to be referred to in description of the configuration of a substrate employed in the solid-state imaging apparatus shown in FIG. 1.

FIG. 2A is a diagram showing the substrate configuration of the conventional MOS solid-state imaging apparatus 151. As shown in the figure, the conventional MOS solid-state imaging apparatus 151 is configured to include a pixel area 153, a control circuit 154 and a logic circuit 155 which are mounted in one semiconductor chip 152. The logic circuit 155 is a circuit for carrying out signal processing. Normally, the pixel area 153 and the control circuit 154 form an image sensor 156.

Figure 2B:
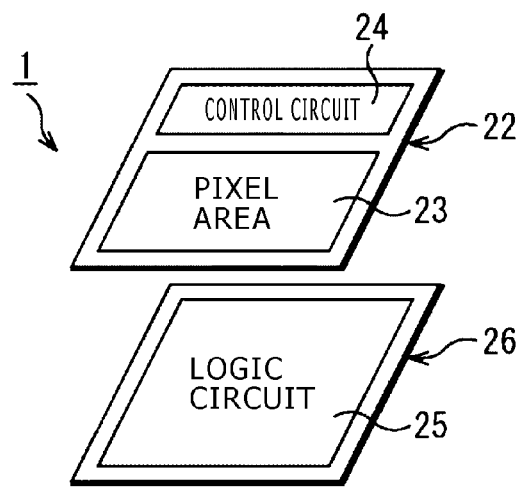
Figure 2C:
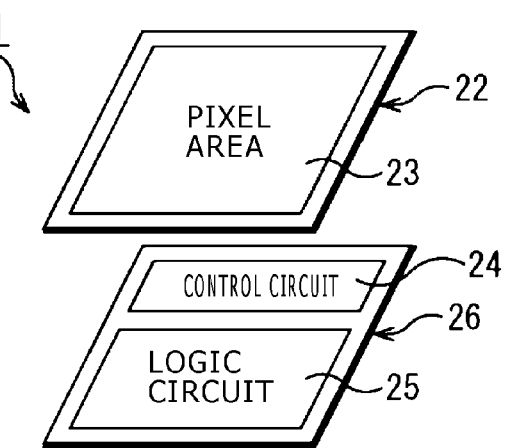

On the other hand, FIGS. 2B and 2C are diagrams each showing the substrate configuration of the solid-state imaging apparatus 1 shown in FIG. 1. As shown in FIG. 2B, in the solid-state imaging apparatus 1 shown in FIG. 1, a pixel area 23 and a control circuit 24 are mounted on a first semiconductor chip 22. In addition, a logic circuit 25 including a signal processing circuit for carrying out signal processing is mounted on a second semiconductor chip 26. The first semiconductor chip 22 and the second semiconductor chip 26 are electrically connected to each other to form a semiconductor substrate 11 on the basis of which, the solid-state imaging apparatus 1 is configured.

As an alternative, as shown in FIG. 2C, in the solid-state imaging apparatus 1, the pixel area 23 is mounted on the first semiconductor chip 22 whereas the control circuit 24 and the logic circuit 25 including a signal processing circuit are mounted on the second semiconductor chip 26. The first semiconductor chip 22 and the second semiconductor chip 26 are electrically connected to each other to form a semiconductor substrate 11 on the basis of which, the solid-state imaging apparatus 1 is configured.

It is to be noted that the solid-state imaging apparatus 1 according to an embodiment to be described below has the configuration shown in FIG. 2B.

Method for Manufacturing Solid-State Imaging Apparatus

Next, by referring to FIGS. 3 to 13, a method for manufacturing the solid-state imaging apparatus 1 is explained as follows.

Figure 3:
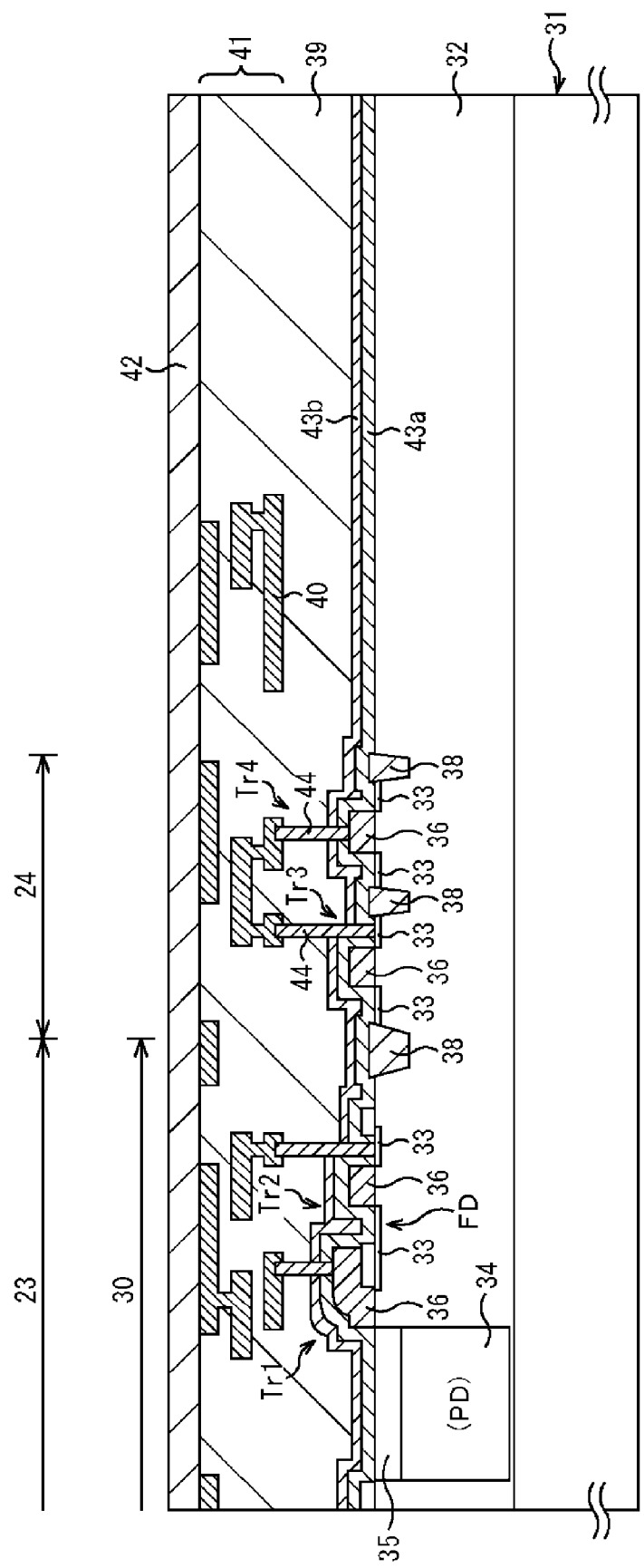
FIG. 3 is a diagram to be referred to in description of a method for manufacturing the solid-state imaging apparatus.

First of all, as shown in FIG. 3, in an area allocated to chip sections of a first semiconductor substrate 31, an image sensor in the state of a half-finished product is created. The image sensor includes the pixel area 23 and the control circuit 24. That is to say, the pixel area 23 and the control circuit 24 are created. In the area allocated to chip sections of the first semiconductor substrate 31 typically made of silicon, a PD (photodiode) serving as an opto-electrical section is also created for every pixel. In a semiconductor well area 32, on the other hand, source and drain areas 33 of every pixel transistor are created. The semiconductor well area 32 is an area created by introducing impurities of the first-conduction type which is typically the p-type. On the other hand, the source and drain areas 33 are created by introducing impurities of the second-conduction type which is typically the n-type. The PD (photodiode) as well as the source and drain areas 33 of the pixel transistors are created by injection of ions from the surface of the substrate.

The PD (photodiode) is created to have an n-type semiconductor area 34 and a p-type semiconductor area 35 on the substrate-surface side. A gate electrode 36 is created on the surface of the substrate forming a pixel by sandwiching a gate insulating film between the gate electrode 36 and the substrate surface. The gate insulating film itself is not shown in the figure. The gate electrode 36 as well as the source and drain areas 33 form two pixel transistors Tr1 and Tr2.

FIG. 3 shows the two pixel transistors Tr1 and Tr2 serving as representatives of a plurality of pixel transistors. For example, the pixel transistor Tr1 adjacent to the PD (photodiode) serves as the transfer transistor whereas the source and drain areas 33 of the pixel transistor Tr1 serve as an FD (Floating Diffusion). Unit pixels 30 are separated from each other by an element separating area 38. The element separating area 38 is configured to include an impurity diffusion layer having a conduction type different from that of a diffusion layer used as a node. The element separating area 38 is created by carrying out the so-called LOCOS (LOCal Oxidation of Silicon) process of oxidizing the first semiconductor substrate 31 in order to create a silicon-oxide film. As an alternative, the element separating area 38 is created by carrying out an STI (Shallow Trench Isolation) process of opening a groove in the first semiconductor substrate 31 and filling up the groove with a silicon-oxide film.

On the side of the control circuit 24, on the other hand, MOS transistors composing the control circuit 24 are created in the first semiconductor substrate 31. FIG. 3 shows MOS transistors Tr3 and Tr4 serving as representatives of the MOS transistors composing the control circuit 24. Each of the MOS transistors Tr3 and Tr4 is created from n-type source and drain areas 33 and a gate electrode 36 created by separating away the gate electrode 36 from the source and drain areas 33 by a gate insulating layer not shown in the figure.

Then, on the surface of the first semiconductor substrate 31, a first-layer inter-layer insulation film 39 is created. Later on, a connection hole is created on the first-layer inter-layer insulation film 39. Then, a connection conductor 44 to be connected to a desired transistor is created. In the process of creating the connection conductors 44 having heights different from each other, a laminated stack is created on the entire surface including the surfaces of the MOS transistors as a stack including a first insulation thin film 43a formed from typically a silicon-oxide film and a second insulation thin film 43b formed from typically a silicon-nitride film. The second insulation thin film 43b serves as an etching stopper in an etching process of creating contact apertures electrically connected to the gate electrode 36 as well as the source and drain areas 33 by filling up the contact apertures with the connection conductors 44 to be described later. The first-layer interlayer insulation film 39 mentioned above is created on the second insulation thin film 43b. Then, in the first-layer inter-layer insulation film 39, connection holes having depths different from each other are selectively created to attain the second insulation thin film 43b which serves as an etching stopper as described above. Subsequently, continuously from the connection holes, the first insulation thin film 43a and the second insulation thin film 43b having the same film thickness in each portion are selectively etched in order to create continuation connection holes. Then, the connection conductors 44 are embedded in their respective connection holes. If the etching stopper for the etching process of creating contact apertures is not required, it is also unnecessary to create the second insulation thin film 43b.

Then, wires 40 of a plurality of layers are created in the first-layer inter-layer insulation film 39 to be connected to the connection conductors 44 in order to create a multi-layer wiring layer 41. In this embodiment, the number of layers is three. The wire 40 is made of typically Cu (copper). In the case of a wire 40 made of copper, the wire 40 is covered by a barrier metal film for avoiding diffusion of the copper. Thus, a cap film for covering the wire 40 is created on the multi-layer wiring layer 41. The cap film is the so-called protection film 42. In the processes carried out so far, the first semiconductor substrate 31 having the control circuit 24 and the pixel area 23 which are in the state of a half-finished product is created.

Figure 4:
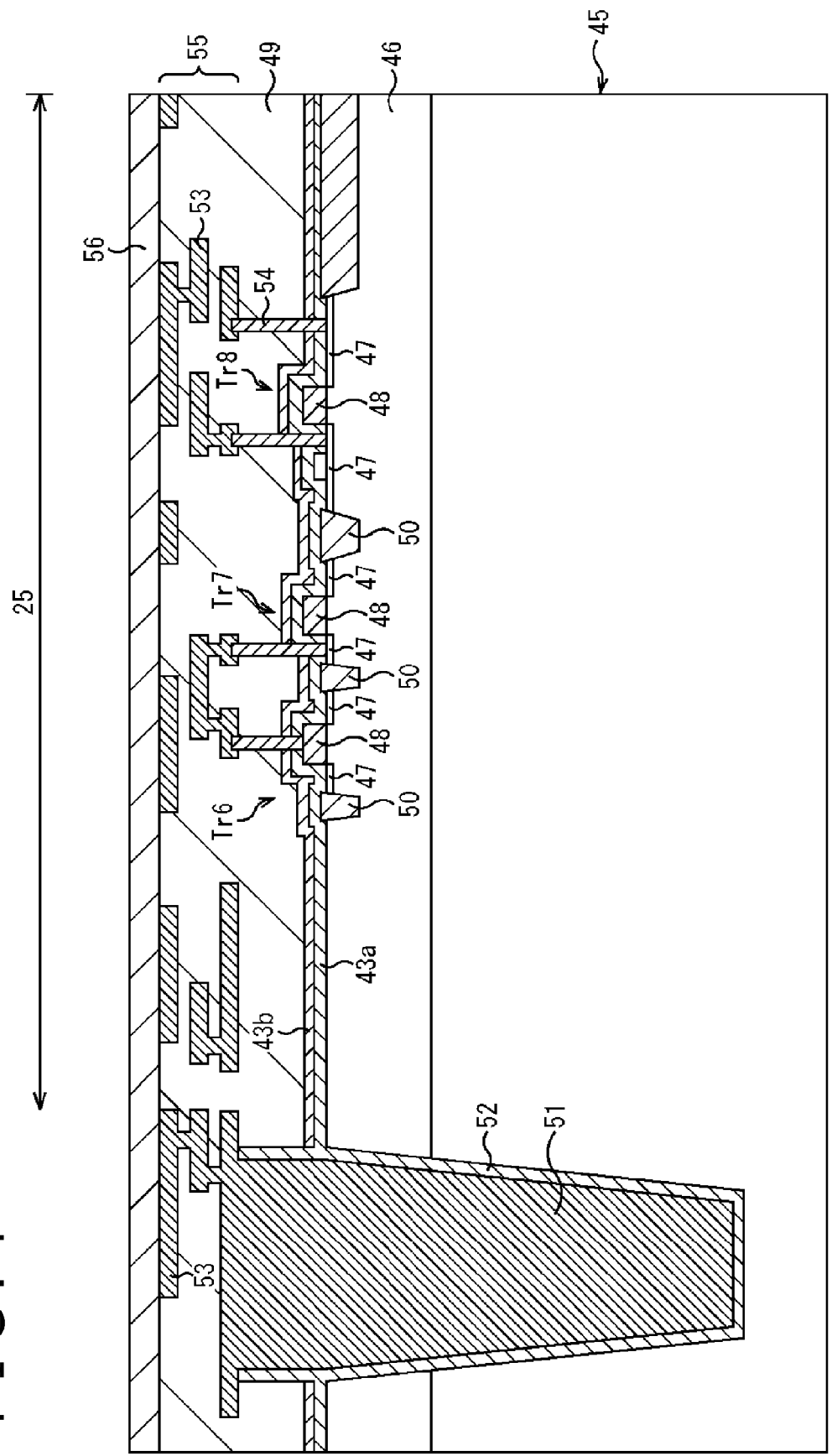
FIG. 4 is a diagram to be referred to in description of the method for manufacturing the solid-state imaging apparatus.

As shown in FIG. 4, on the other hand, in an area allocated to chip sections of a second semiconductor substrate 45, the logic circuit 25 including a signal processing circuit put in the state of a half-finished product to serve as a circuit for processing signals is created. That is to say, in a p-type semiconductor well area 46 on the surface side of the second semiconductor substrate 45 which is typically a silicon substrate, a plurality of MOS transistors composing the logic circuit 25 are created by separating the MOS transistors from each other by making use of an element separating area 50. As representatives of the MOS transistors, MOS transistors Tr6, Tr7 and Tr8 are shown in the figure. Each of the MOS transistors Tr6, Tr7 and Tr8 is created to include n-type source and drain areas 47 forming a pair and a gate electrode 48 created by separating the gate electrode 48 from the n-type source and drain areas 47 by a gate insulating film. CMOS transistors can be used to replace the MOS transistors Tr6, Tr7 and Tr8.

Then, on the surface of the second semiconductor substrate 45, a first-layer inter-layer insulation film 49 is created. Later on, a connection hole is created on the first-layer inter-layer insulation film 49 whereas a connection conductor 54 to be connected to a desired transistor is created. In the process of creating the connection conductors 54 having heights different from each other, in the same way as the process described earlier, a laminated stack is created on the entire surface including the surfaces of the MOS transistors as a stack comprising a first insulation thin film 43a formed from typically a silicon-oxide film and a second insulation thin film 43b formed from typically a silicon-nitride film. The second insulation thin film 43b serves as an etching stopper in an etching process. The first-layer inter-layer insulation film 49 mentioned above is created on the second insulation thin film 43b. Then, in the first-layer inter-layer insulation film 49, connection holes having depths different from each other are selectively created to attain the second insulation thin film 43b which serves as an etching stopper. Subsequently, continuously from the connection holes, the first insulation thin film 43a and the second insulation thin film 43b having the same film thickness in each portion are selectively etched in order to create continuation connection holes. Then, the connection conductors 54 are embedded in their respective connection holes.

At a desired position in the area allocated to chip sections, on the other hand, a connection hole is created, starting from the surface of the first-layer inter-layer insulation film 49 to a desired depth in the second semiconductor substrate 45. In this connection hole, a connection conductor 51 for a fetching electrode is embedded. The connection conductor 51 can be made of a material such as Cu (copper), W (tungsten) or poly-silicon. Before the connection conductor 51 is embedded in the connection hole, an insulation film 52 for insulating the connection conductor 51 and the second semiconductor substrate 45 from each other is created on the surface of an inner wall of the connection hole.

Then, wires 53 of a plurality of layers to serve as a multi-layer wiring layer 55 is created in the first-layer inter-layer insulation film 49 so that the wires 53 are connected to the connection conductor 54 and the connection conductor 51 for the fetching electrode. In this embodiment, the number of such layers is 3. The wire 53 is made of typically Cu (copper). In the same way as what has been explained earlier, on the multi-layer wiring layer 55, a cap film for covering the wire 53 is created. The cap film is the so-called protection film 56. In the processes carried out so far, the second semiconductor substrate 45 having the logic circuit 25 in the state of a half-finished product is created.

Figure 5:
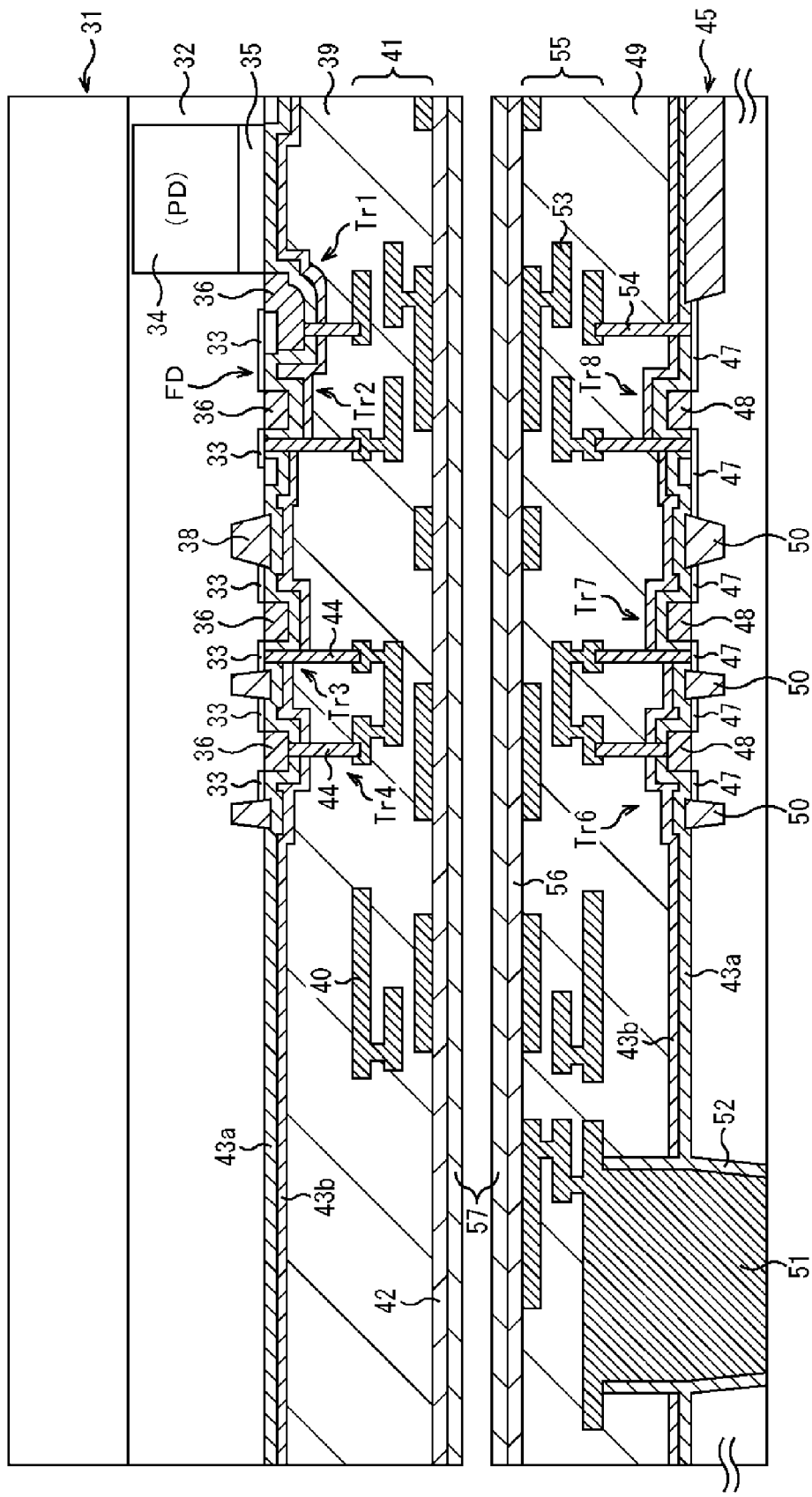
FIG. 5 is a diagram to be referred to in description of the method for manufacturing the solid-state imaging apparatus.
Figure 6:
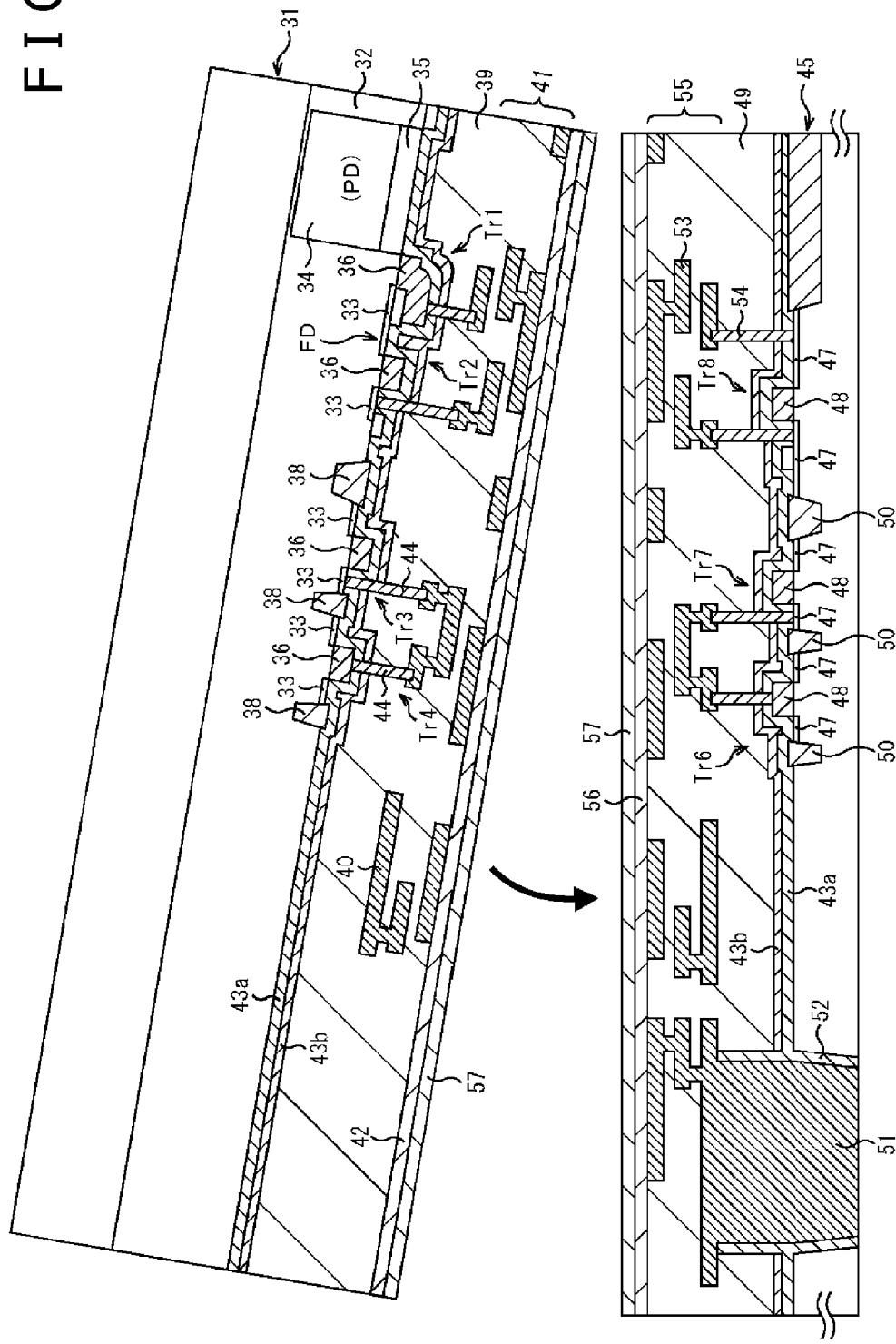
FIG. 6 is a diagram to be referred to in description of the method for manufacturing the solid-state imaging apparatus.
Figure 7:
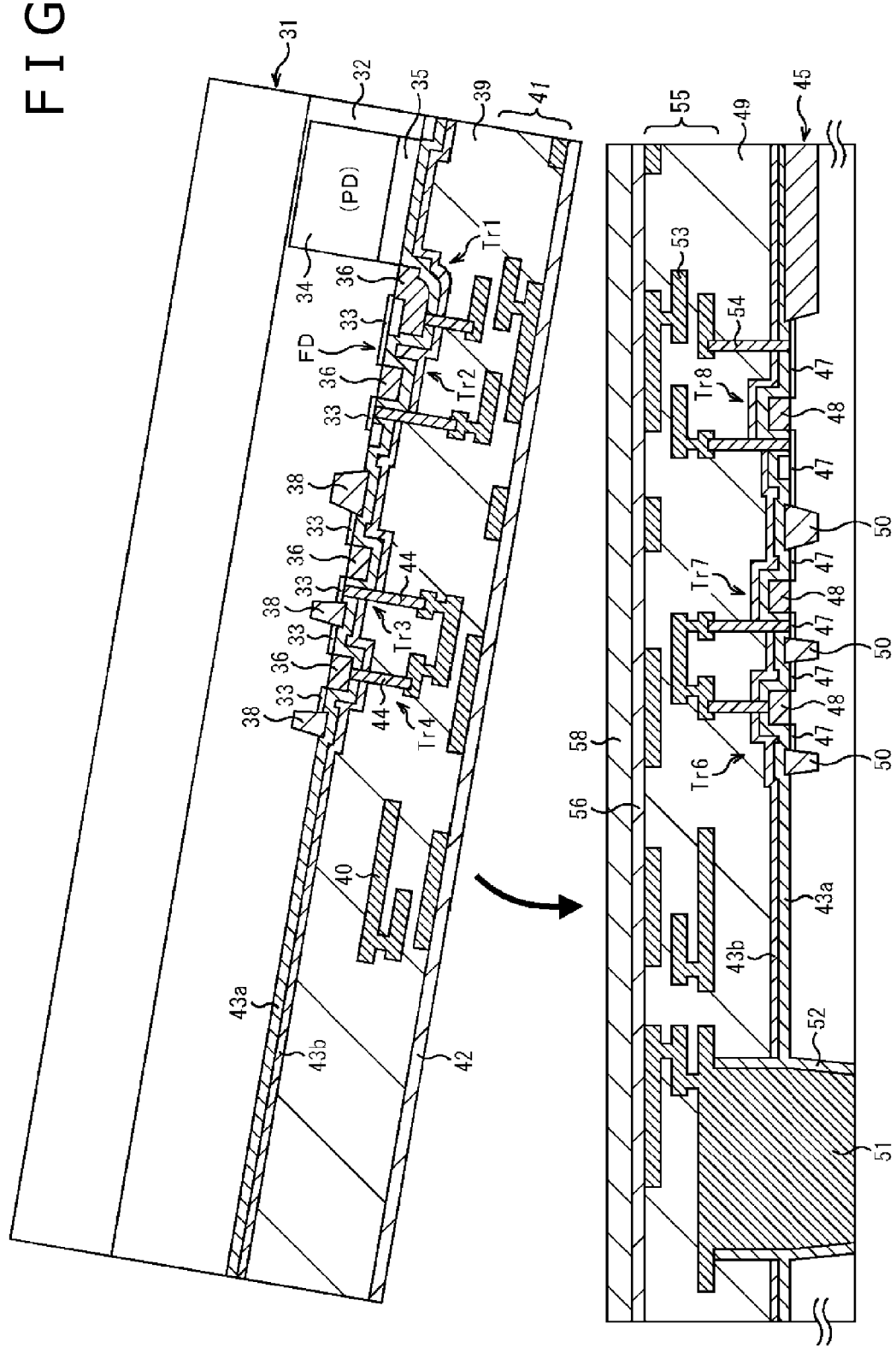
FIG. 7 is a diagram to be referred to in description of the method for manufacturing the solid-state imaging apparatus.

Then, as shown in FIG. 5, the first semiconductor substrate 31 and the second semiconductor substrate 45 are pasted on each other so that the multi-layer wiring layers 41 and 55 face each other. The pasting process can be a plasma bonding process or a bonding process making use of a bonding agent. In this embodiment, the pasting process is a plasma bonding process. In the case of the plasma bonding process, as shown in FIG. 6, on each of the bonding faces between the first semiconductor substrate 31 and the second semiconductor substrate 45, a film 57 is created. The film 57 can be a plasma TEOS (Tetraethyl orthosilicate) film, a plasma SiN film, an SiON film (also referred to as a block film) or an SiC film. The bonding faces on each of which the film 57 has been created are then subjected to plasma processing in order to superimpose the bonding faces on each other. Later on, the bonding faces are subjected to anneal processing in order to bond the bonding faces to each other. It is desirable that the pasting process is carried out at a low temperature such as a temperature not exceeding 400 degrees Celsius. This is because, at such a low temperature, there is no effect on wires and other components. In the case of the bonding process making use of a bonding agent, on the other hand, on either one of the bonding faces between the first semiconductor substrate 31 and the second semiconductor substrate 45, a bonding-agent layer 58 is created as shown in FIG. 7. Then, processing is carried out to superimpose the bonding faces on each other so that the bonding faces are bonded to each other through the bonding-agent layer 58.

Figure 8:
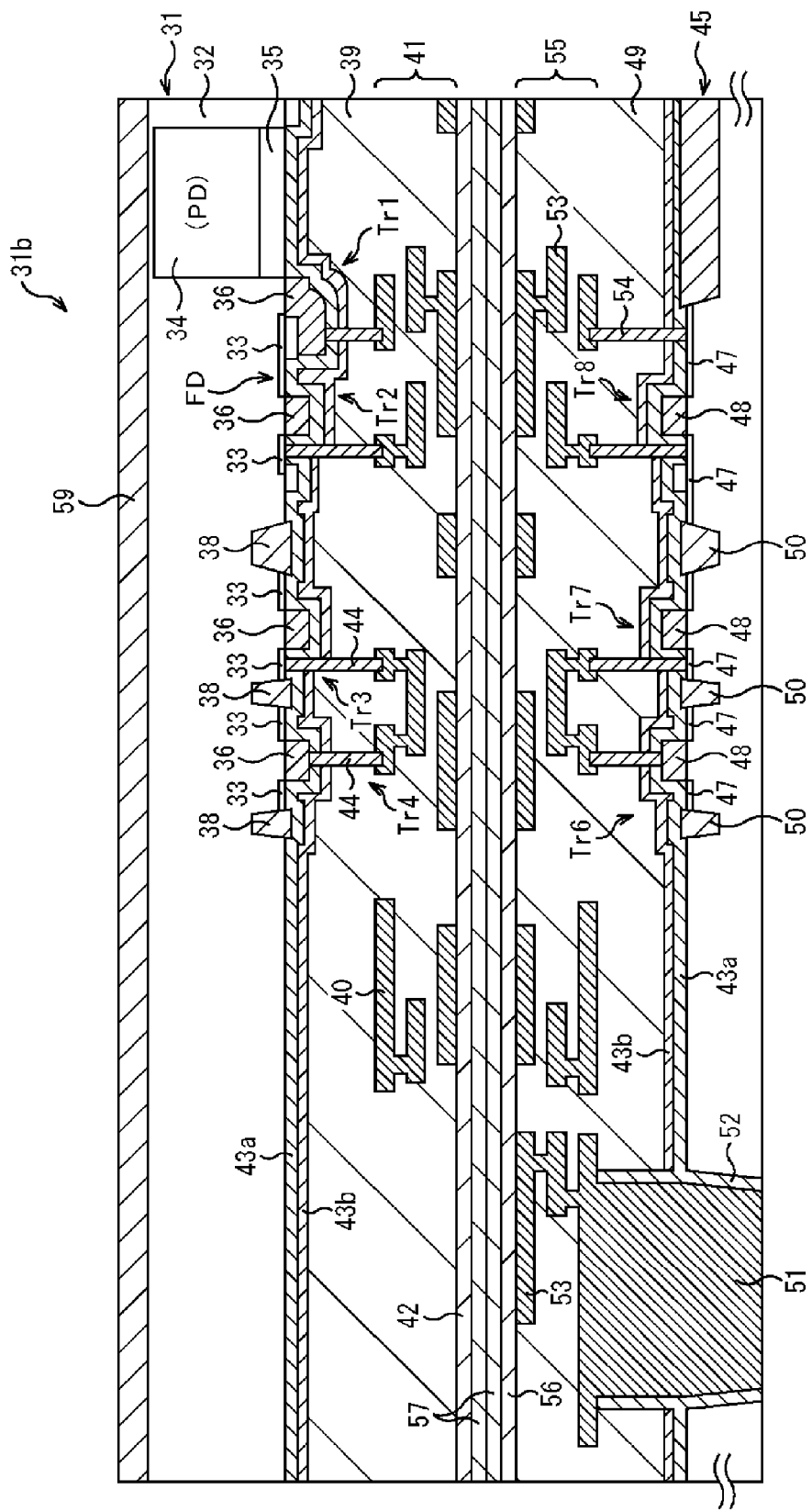
FIG. 8 is a diagram to be referred to in description of the method for manufacturing the solid-state imaging apparatus.

Subsequently, as shown in FIG. 8, grinding and polishing processes are carried out, being started from the side of the rear surface 31b of the first semiconductor substrate 31 in order to reduce the film thickness of the first semiconductor substrate 31. The process of reducing the film thickness is carried out in order to make the film thickness close to that of the PD (photodiode). After the process of reducing the film thickness has been finished, on the rear surface of the PD (photodiode), a p-type semiconductor layer for suppressing a dark current is created. The p-type semiconductor layer itself is not shown in the figure. For example, the original film thickness of the first semiconductor substrate 31 is about 600 microns. In this case, the film thickness of the first semiconductor substrate 31 is reduced to a value in a range of 1 micron to 10 microns or, desirably, a value in a range of 1 micron to 5 microns. In the past, such a film-thickness reduction process was carried out by pasting a support substrate prepared separately. In accordance with the embodiment, however, the process of reducing the film thickness of the first semiconductor substrate 31 is carried out by making use of the second semiconductor substrate 45, on which the logic circuit 25 has been created, also as a support substrate. After the process of reducing the film thickness has been finished, an inter-layer insulation film 59 made from typically a silicon-oxide film is created on the rear surface of the substrate. The rear surface 31b of the first semiconductor substrate 31 is the light incidence surface when the solid-state imaging apparatus is configured as an apparatus having the rear radiation type.

Figure 9:
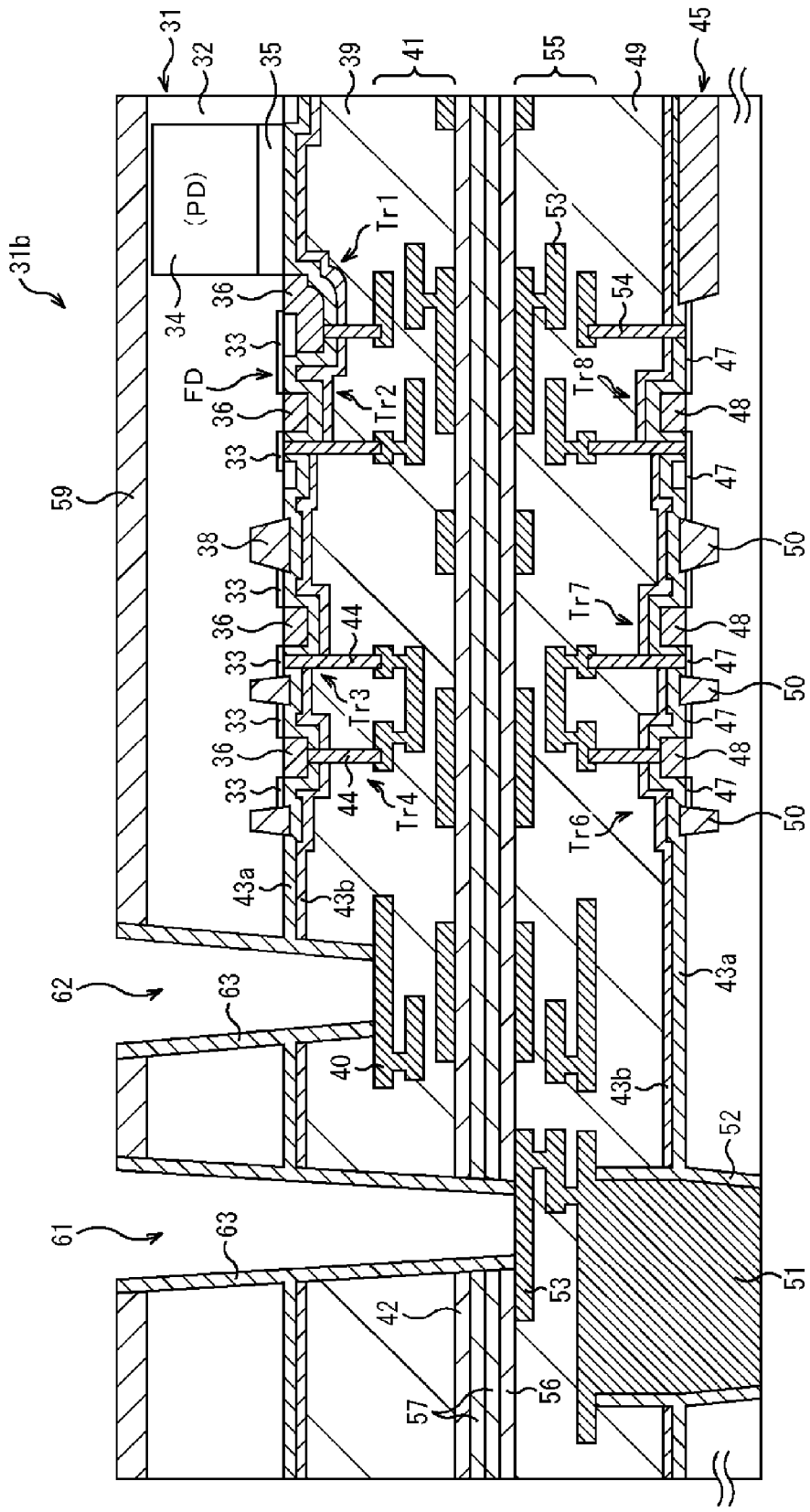
FIG. 9 is a diagram to be referred to in description of the method for manufacturing the solid-state imaging apparatus.

Subsequently, as shown in FIG. 9, for the first semiconductor substrate 31 completing the film-thickness reduction process, at a desired position in an area allocated to chip sections, a penetration connection hole 61 starting from the side of the rear surface 31b is created. The penetration connection hole 61 penetrates the first semiconductor substrate 31 and attains the top-layer wire 53 of the second semiconductor substrate 45. In addition, on the first semiconductor substrate 31, at a position adjacent to the penetration connection hole 61, a connection hole 62 starting from the side of the rear surface 31b is created. The connection hole 62 reaches the wire 40 of the first layer in the first semiconductor substrate 31. Each of the penetration connection hole 61 and the connection hole 62 can be created to have a contact diameter size in a range of 1 micron to 5 microns. Since each of the penetration connection hole 61 and the connection hole 62 is created after the film thickness of the first semiconductor substrate 31 has been reduced, the aspect ratio decreases so that it is possible to create fine holes. In addition, each of the penetration connection hole 61 and the connection hole 62 can be created to have a contact depth in a typical range of about 5 microns to about 15 microns. Then, an insulation film 63 is created on the surface of an inner wall of each of the penetration connection hole 61 and the connection hole 62. The insulation film 63 is a film for providing electrical insulation with the first semiconductor substrate 31.

At this point of time, processes of manufacturing the pixel area 23 have not been completed because processes of manufacturing an on-chip color filter and an on-chip micro-lens have not been carried out. In addition, processes of manufacturing the pixel area 23 have not been completed also because only circuits up to the highest-level wire 53 have been created. From the circuit-technology point of view, the process of creating the highest-level wire 53 is optimum. Thus, the manufacturing cost can be suppressed.

Figure 10:
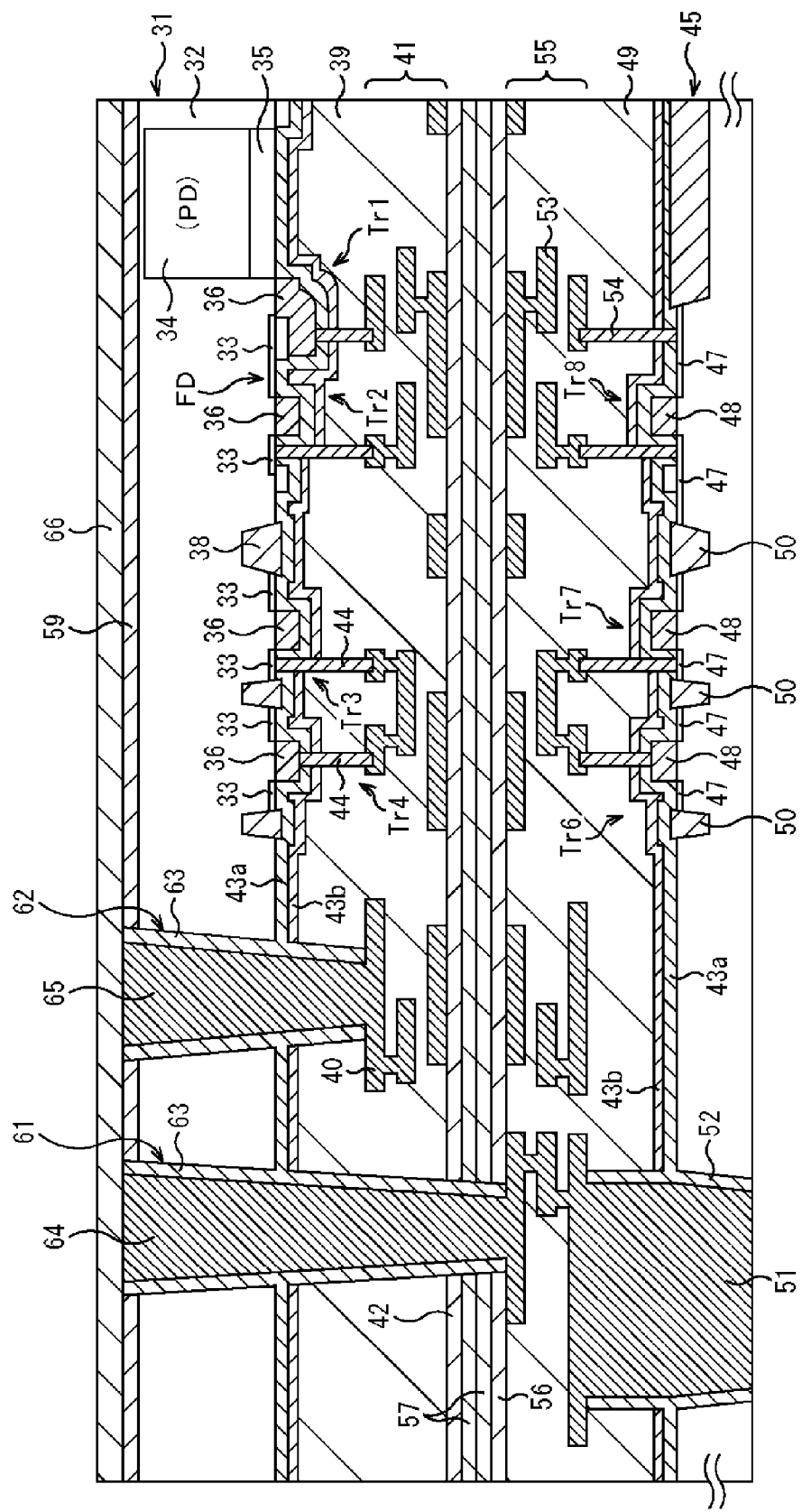
FIG. 10 is a diagram to be referred to in description of the method for manufacturing the solid-state imaging apparatus.

Subsequently, as shown in FIG. 10, a penetration connection conductor 64 and a connection conductor 65 are embedded in the penetration connection hole 61 and the connection hole 62 respectively. Each of the penetration connection conductor 64 and the connection conductor 65 can be made of a metal such as Cu (copper), W (tungsten) or Al (aluminum).

Later on, on the entire rear surface of the first semiconductor substrate 31, an insulation protection film 66 is created. The insulation protection film 66 can be a film such as an SiCN film, a plasma silicon nitride film or SiC film.

Figure 11:
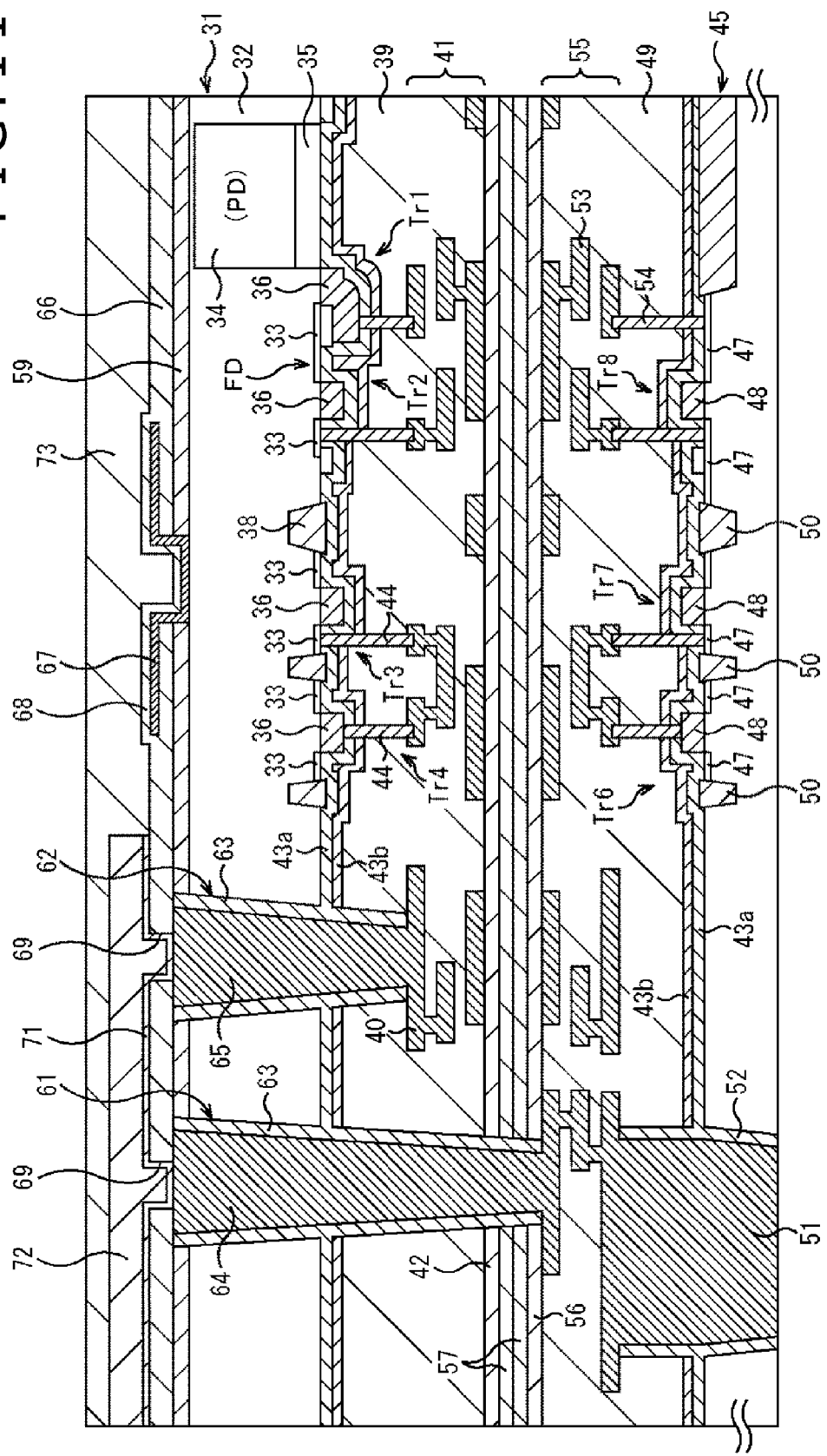
FIG. 11 is a diagram to be referred to in description of the method for manufacturing the solid-state imaging apparatus.

Subsequently, as shown in FIG. 11, a light blocking film 67 is created on an area which should be protected against light. In the model diagram of FIG. 11, the light blocking film 67 is created on the control circuit 24. However, the light blocking film 67 is also created on the other pixel transistors. The light blocking film 67 can be made of a metal such as tungsten. The light blocking film 67 is electrically connected to the semiconductor well area 32 connected to the ground so that it is possible to prevent the light blocking film 67 from entering an electrically floating state. Conversely, if the electric potential of the ground is applied to the light blocking film 67 which is electrically connected to the semiconductor well area 32, it is possible to prevent the semiconductor well area 32 from entering an electrically floating state. Then, a passivation film 68 is created on the entire surface in order to cover the light blocking film 67. The passivation film 68 can be a film such as a plasma silicon nitride film or a CVD-SIN film.

The passivation film 68 and the insulation protection film 66 have portions corresponding to the penetration connection conductor 64 and the connection conductor 65. Connection holes 69 are created in these portions. Then, a connection wire 72 is created on the connection hole 69 to sandwich a barrier metal film 71 between the connection wire 72 and the connection hole 69. The connection wire 72 is typically an aluminum film. The barrier metal film 71 is a laminated stack comprising typically a lower layer made of Ti and an upper layer made of TiN. The connection wire 72 is connected to the penetration connection conductor 64 and the connection conductor 65 through the connection holes 69. The connection wire 72 is used for connecting the pixel area 23 and the control circuit 24 to the logic circuit 25. The connection wire 72 plays a role as the so-called electrode pad for a fetching electrode starting from the top surface. In the following description, the connection wire 72 is also referred to as the electrode pad 72.

Thus, the image sensor and the logic circuit 25 are electrically connected to each other through the connection conductor 65, the electrode pad 72 and the penetration connection conductor 64. As described above, the image sensor includes the pixel area 23 and the control circuit 24 which are created on the first semiconductor substrate 31 whereas the logic circuit 25 is created on the second semiconductor substrate 45. Later on, a flattening film 73 is created on the electrode pad 72, the passivation film 68 and the insulation protection film 66.

Figure 12:
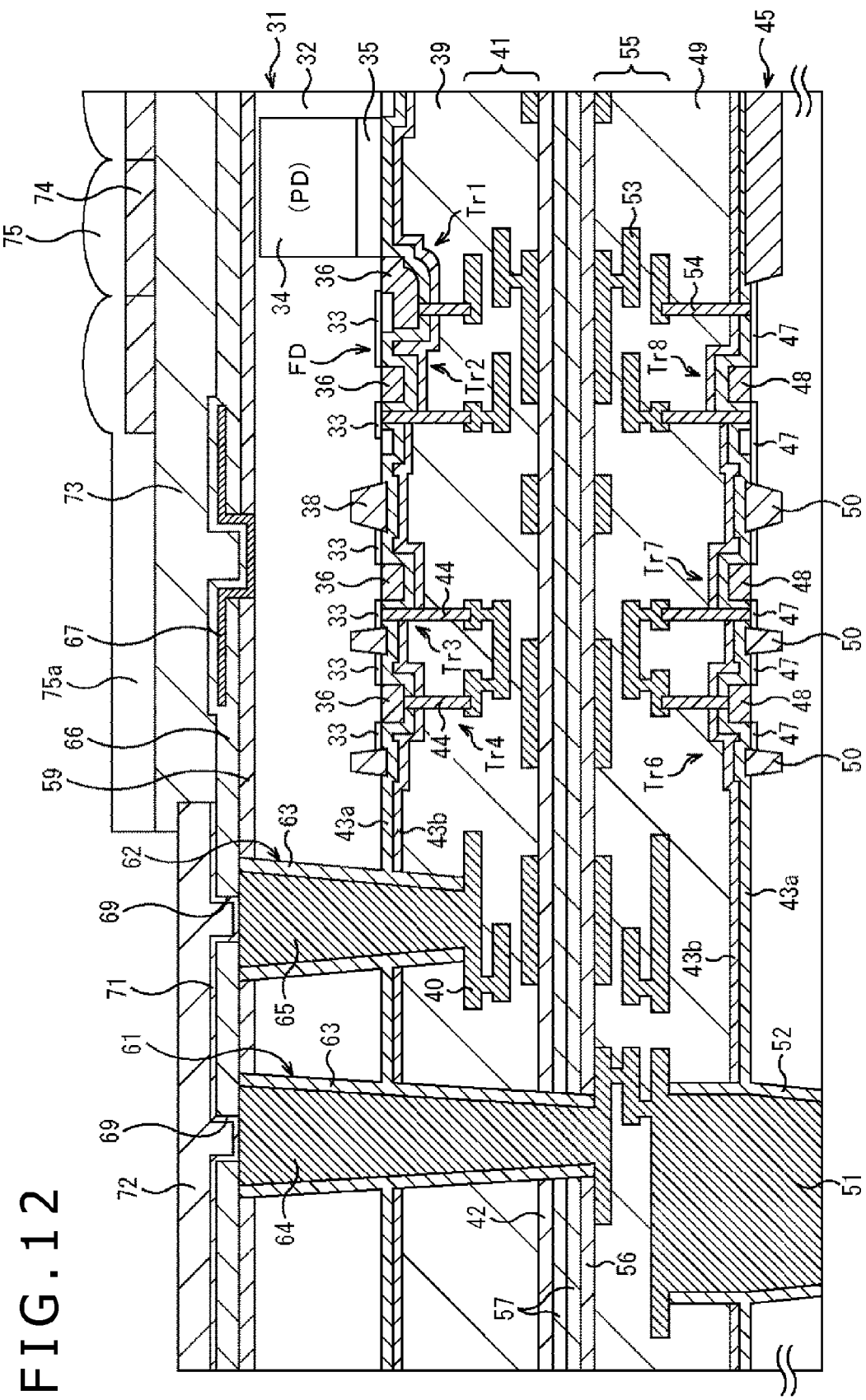
FIG. 12 is a diagram to be referred to in description of the method for manufacturing the solid-state imaging apparatus.

Subsequently, as shown in FIG. 12, for every pixel, on-chip color filters 74 such as an R (red) on-chip filter, a G (green) on-chip filter and a B (blue) on-chip filter are created on the flattening film 73. Then, an on-chip micro-lens 75 is created on each of the on-chip color filters 74. The on-chip color filter 74 and the on-chip micro-lens 75 are created for every unit pixel in the pixel area 23. It is to be noted that, in order to make the explanation of the embodiment easy to understand, FIG. 12 is given as an enlarged diagram showing a cross-sectional structure excluding the on-chip color filter 74 and the on-chip micro-lens 75. Thus, the pitch dimensions of the on-chip color filter 74 and the on-chip micro-lens 75 look smaller than the pitch dimension of the unit pixel. Then, a lens material film 75a and the flattening film 73 are selectively removed by carrying out an etching process in order to expose the electrode pad 72.

Figure 13:
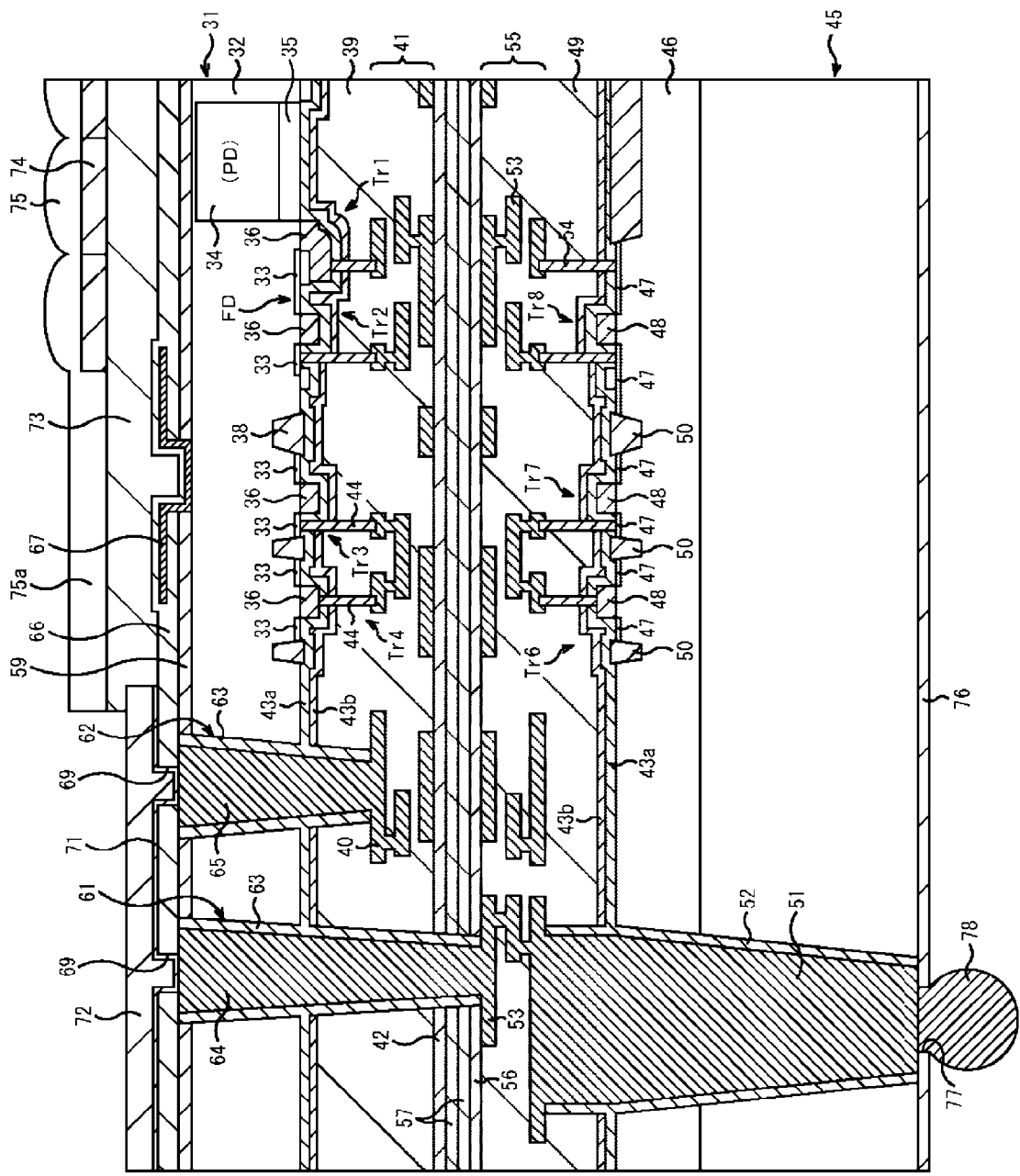
FIG. 13 is a diagram to be referred to in description of the method for manufacturing the solid-state imaging apparatus.

On the side of the second semiconductor substrate 45, on the other hand, as shown in FIG. 13, the surface is subjected to grinding and polishing processes in order to expose the surface of the connection conductor 51 functioning as the fetching electrode. The second semiconductor substrate 45 has a surface exposed to the connection conductor 51. Then, after a passivation film 76 has been created on the surface exposed to the connection conductor 51, an aperture 77 is created for the connection conductor 51 and an electrode bump 78 is created in a state of being electrically connected to the connection conductor 51 through the aperture 77.

Thus, in the first semiconductor substrate 31, the pixel area 23 and the control circuit 24 are put in the state of a finished product. In the second semiconductor substrate 45, the logic circuit 25 is also put in the state of a finished product. Then, finally, a junction substrate shown in FIG. 13 is configured from the first semiconductor substrate 31 and the second semiconductor substrate 45, which are bonded to each other, and the junction substrate is divided into chips in order to complete the process of manufacturing the solid-state imaging apparatus 1 shown in FIGS. 1 and 2B. That is to say, the chip unit of the first semiconductor substrate 31 shown in FIG. 13 is the first semiconductor chip 22 shown in FIG. 2B whereas the chip unit of the second semiconductor substrate 45 shown in FIG. 13 is the second semiconductor chip 26 shown in FIG. 2B.

In the solid-state imaging apparatus 1, when the electrode pad 72 is used, the electrode pad 72 can be subjected to a wire bonding process in order to connect the electrode pad 72 to an external wire. When the electrode bump 78 is used, on the other hand, the electrode bump 78 can be subjected to a face down bonding process in order to connect the electrode bump 78 to an external wire. Thus, as desired by the user, either of the electrode pad 72 and the electrode bump 78 can be used.

The solid-state imaging apparatus 1 can be examined by typically making use of the electrode pad 72. In addition, the solid-state imaging apparatus 1 is examined twice. In the first examination, the solid-state imaging apparatus 1 is examined in a wafer state. In the second examination, on the other hand, the solid-state imaging apparatus 1 is examined by dividing the wafer into chips and checking the solid-state imaging apparatus 1 put in the state of a final module.

In accordance with the manufacturing method described above as a method for manufacturing the solid-state imaging apparatus 1, the pixel area 23 and the control circuit 24 are created in a chip section of the first semiconductor substrate 31 whereas the logic circuit 25 for processing signals is created in a chip section of the second semiconductor substrate 45. In this way, the solid-state imaging apparatus 1 is manufactured into a configuration in which the function of the pixel area 23 is provided in a chip section different from the chip section for the function of the logic circuit 25. Thus, it is possible to adopt a process creation technology optimum for the pixel area 23 and a process creation technology optimum for the logic circuit 25. Accordingly, the pixel area 23 and the logic circuit 25 are capable of sufficiently exhibiting their respective performances. As a result, the solid-state imaging apparatus 1 having a high performance can be presented.

If the configuration shown in FIG. 2C is adopted, it is necessary to create only the pixel area 23 for receiving light on the side of the first semiconductor chip 22. In this configuration, the control circuit 24 and the logic circuit 25 are separated from the pixel area 23, being created in the second semiconductor chip 26. Thus, it is possible to independently select a process technology optimum for each of the functional chips. In addition, the area of the product module can be reduced.

As explained earlier, the first semiconductor substrate 31 has the pixel area 23 and the control circuit 24 whereas the second semiconductor substrate 45 has the logic circuit 25. In accordance with the manufacturing method described above, with both the first semiconductor substrate 31 and the second semiconductor substrate 45 put in the state of a half-finished product, the first semiconductor substrate 31 and the second semiconductor substrate 45 are pasted on each other. At that time, the first semiconductor substrate 31 is made thin in a thickness reduction process. That is to say, in the thickness reduction process of reducing the thickness of the first semiconductor substrate 31, the second semiconductor substrate 45 is used also as a support substrate. It is thus possible to decrease the number of materials and the number of manufacturing processes. In addition, since the penetration connection hole 61 is created after the thickness reduction process has been carried out, the aspect ratio of the penetration connection hole 61 decreases so that a high-precision penetration connection hole 61 can be created. On top of that, the penetration connection conductor 64 is embedded in the penetration connection hole 61 having a low aspect ratio whereas the connection conductor 65 is embedded in the connection hole 62. Thus, it is of course possible to make use of a metal material having a good coverage characteristic as is the case with W (tungsten) or the like. In addition, it is also possible to make use of a metal material having a poor coverage characteristic as is the case with Cu (copper) or the like. That is to say, there are no restrictions imposed on the conductive material used for connections. Thus, the pixel area 23 and the control circuit 24 can be electrically connected to the logic circuit 25 with a high degree of precision. As a result, it is possible to implement mass production, suppress the manufacturing cost and manufacture the solid-state imaging apparatus 1 displaying a high performance.

2: Detailed Processes of Embedding Penetration Connection Conductors and Connection Conductors The processes of manufacturing the solid-state imaging apparatus 1 described above include processes of embedding penetration connection conductors 64 and connection conductors 65. The processes of embedding penetration connection conductors 64 and connection conductors 65 are explained in detail below. That is to say, the following description explains details of the processes explained earlier by referring to FIGS. 9 and 10.

Figure 14A:
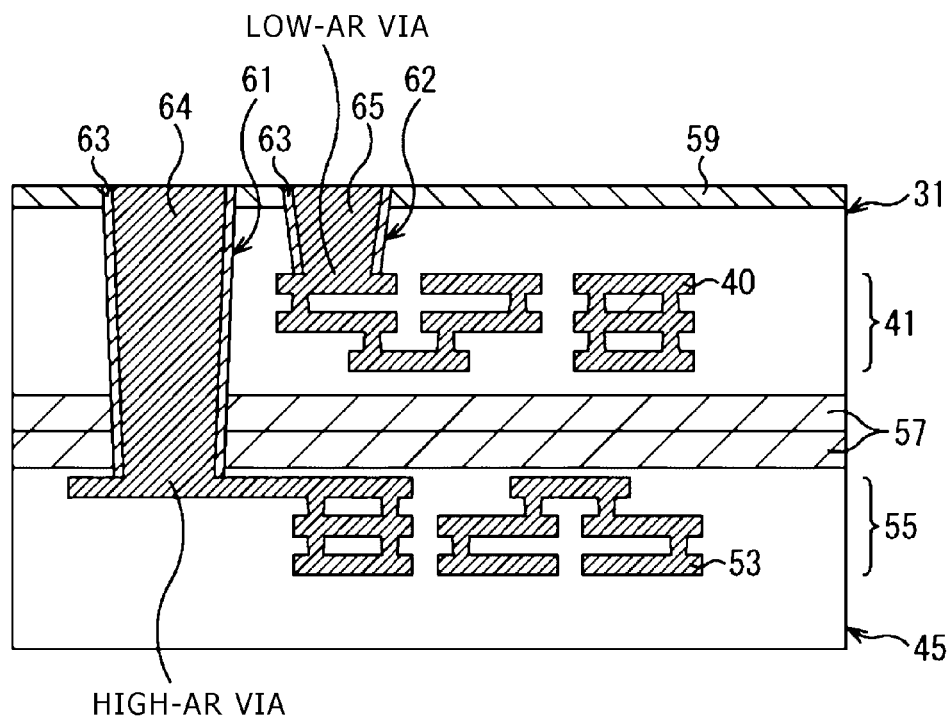
FIGS. 14A and 14B are enlarged outline diagrams showing a penetration connection hole and the vicinity of the penetration connection hole.

Enlarged Diagrams Showing Vicinities of Penetration Connection Hole and Connection Hole FIG. 14A is a diagram roughly showing the vicinities of the penetration connection hole 61 and the connection hole 62 of a first embodiment. The figure shows only portions included in the configuration shown in FIG. 10 as portions each related to what is described below. On the other hand, FIG. 14B is an enlarged diagram showing the penetration connection hole 61.

Figure 14B:
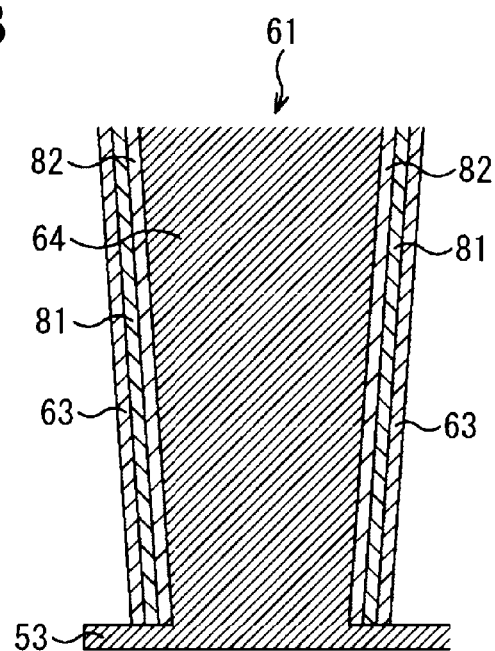

As shown in FIG. 14B, a barrier metal film 81 and a Cu seed layer 82 are created between the insulation film 63 included in the penetration connection hole 61 and the penetration connection conductor 64 embedded in the penetration connection hole 61. The barrier metal film 81 is a film for preventing the penetration connection conductor 64 made of Cu from diffusing whereas the Cu seed layer 82 is a layer which serves as an electrode when the penetration connection conductor 64 is embedded in the penetration connection hole 61 by adoption of the electrolytic-plating method. The barrier metal film 81 is made of a material such as Ta (tantalum), Ti (titan), W (tungsten), Zr (zirconium), a nitride film or a carbide film, to mention a few. In this embodiment, the barrier metal film 81 is made of Ta (tantalum). Also for the connection hole 62, a barrier metal film 81 and a Cu seed layer 82 are created in the same way as the penetration connection hole 61.

As shown in FIG. 14A, the penetration connection hole 61 is connected to the second semiconductor substrate 45 through a pasting face. Thus, the penetration connection hole 61 is deep in comparison with the connection hole 62 in the first semiconductor substrate 31. That is to say, the penetration connection hole 61 and the connection hole 62 are connection holes having aspect ratios different from each other. In the following description, the penetration connection hole 61 and the connection hole 62 are also referred to as a high-AR (Aspect Ratio) via and a low-AR via respectively in some cases.

In adjustment of an optimum time for an etching process carried out at a dry etching fabrication time, it is difficult to adjust the optimum time for the penetration connection hole 61 having a deep via bottom in comparison of the penetration connection hole 61 serving as the high-AR via with the connection hole 62 serving as the low-AR via. In addition, in an ashing process of eliminating post-etching residues and in a process of optimizing the residue elimination by making use of a chemical cleanser, the penetration connection hole 61 is difficult to treat in comparison with the connection hole 62. For this reason, in the case of the penetration connection hole 61, execution of an etching process as pre-processing prior to the formation of the barrier metal film 81 is effective. In this case, the etching process is carried out by adoption of a physical sputtering method for physically eliminating the residues.

Since the pre-processing is also carried out at the same time for the connection hole 62 serving as a low-AR via, however, there is raised a problem that an excessive etching process is inevitably performed on the connection hole 62 having a shallow via bottom. If an excessive etching process is carried out on the connection hole 62, the wire 40 connected to the lower portion of the connection hole 62 is inadvertently ground down and the ground wire segments are spread to inner walls in the vicinity of the lower portion of the connection hole 62. Thus, the coverage of the barrier metal film 81 created later deteriorates. If the coverage of the barrier metal film 81 deteriorates, the adherence to the Cu seed layer 82 becomes insufficient. The insufficient adherence to the Cu seed layer 82 causes Cu voids to be generated. If Cu voids are generated, it is quite within the bounds of possibility that the electrical resistance becomes unstable and the reliability of the connection via deteriorates. That is to say, there is a difference in physical elimination quantity between the penetration connection hole 61 serving as a high-AR via difficult to clean and the connection hole 62 serving as a low-AR via easy to clean. Thus, there is raised a problem that it is hard to obtain via resistances stable in both the high-AR via and the low-AR via.

Figure 15:
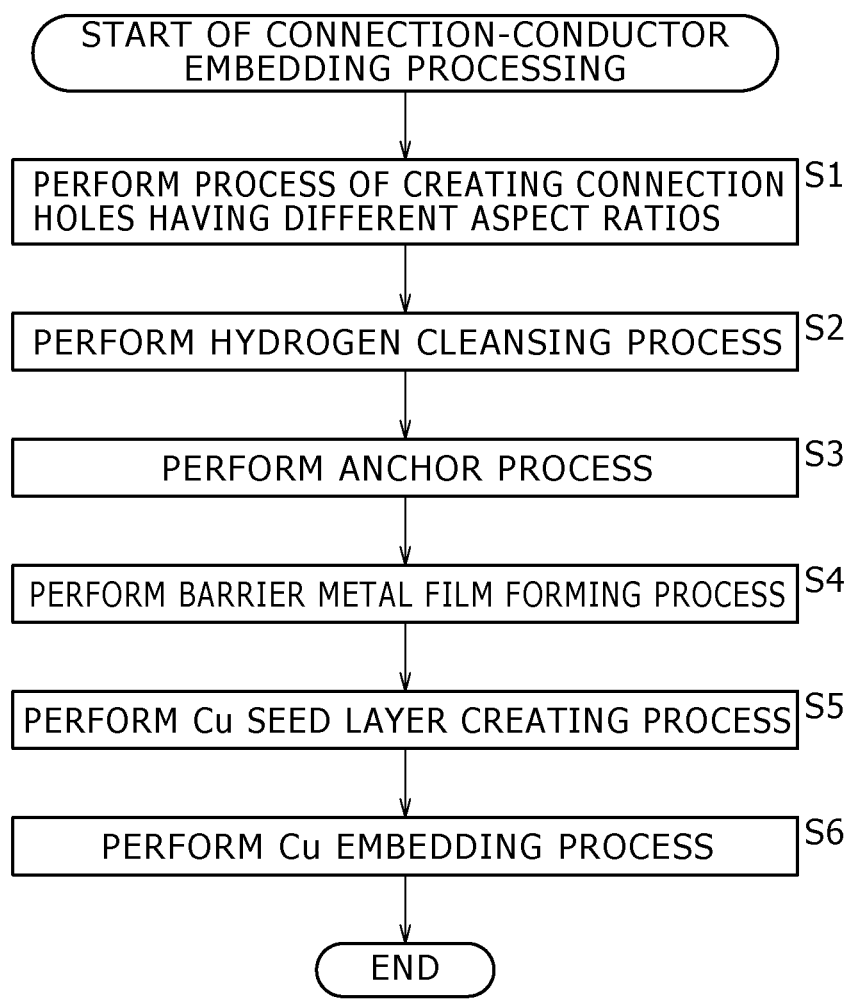
FIG. 15 shows an explanatory flowchart to be referred to in description of processes in states shown in FIGS. 9 and 10.

In order to solve the problems described above, the solid-state imaging apparatus 1 according to the present technology adopts a method represented by an explanatory flowchart shown in FIG. 15. This method allows processing optimum for both the high-AR via and the low-AR via to be carried out.

Flow of Processing to Create Connection Routes

FIG. 15 shows the flowchart referred to in the following description of connection-conductor embedding processing carried out by the solid-state imaging apparatus 1 as processing which starts with the step of creating both the high-AR via and the low-AR via and ends with the step of embedding connection conductors in the high-AR via and the low-AR via.

First of all, the flowchart begins with a step S1 at which a connection-hole creating process is carried out to create a plurality of connection holes having aspect ratios different from each other from the side of the rear surface 31b of the first semiconductor substrate 31 as shown in FIG. 9. The connection holes created at this step are the penetration connection hole 61 and the connection hole 62.

Then, at the next step S2, a hydrogen cleansing process is carried out to cleanse the penetration connection hole 61 and the connection hole 62 by making use of hydrogen gas having a temperature in a range of 200 to 300 degrees Celsius. At that time, due to natural oxidation, a Cu oxide is created on the surface of a Cu wire at the via bottom of each of the penetration connection hole 61 and the connection hole 62. In the next anchor-processing process to be described later, a physical etching process is not deliberately carried out for the via bottom of the connection hole 62 serving as a low-AR via. Thus, it is quite within the bounds of possibility that the Cu oxide is not removed. In order to solve this problem, a reduction process is carried out at the step S2 by making use of hydrogen gas. By carrying out the reduction process, it is possible to cleanse the Cu wire surface at the via bottom of the connection hole 62 so that the Cu wire surface becomes a boundary face allowing a clean inter-metal junction to be created thereon.

Then, at the next step S3, an anchor-processing process is carried out to simultaneously perform a physical etching process making use of anchor gas and a film formation process of forming the barrier metal film 81 for both the penetration connection hole 61 and the connection hole 62 at the same time in a chamber for forming the barrier metal film 81. In this anchor-processing process, a physical etching process is deliberately carried out for the via bottom of the penetration connection hole 61 serving as a high-AR via. As explained above, however, a physical etching process is not deliberately carried out for the via bottom of the connection hole 62 serving as a low-AR via entailing a small boring quantity. Thus, the boring quantity of the via bottom of the penetration connection hole 61 serving as a high-AR via is large in comparison with the boring quantity of the via bottom of the connection hole 62 serving as a low-AR via.

Then, at the next step S4, in the chamber for forming the barrier metal film 81, a barrier metal film formation process is carried out by stopping a physical etching process making use of argon gas. The barrier metal film formation process is carried out only in order to form the barrier metal film 81 for the penetration connection hole 61 and the connection hole 62 at the same time.

Then, at the next step S5, a Cu seed film formation process is carried out to form the Cu seed layer 82 on the penetration connection hole 61 and the connection hole 62 with the barrier metal film formation process already carried out to form the barrier metal film 81 for the penetration connection hole 61 and the connection hole 62.

Then, at the next step S6, a Cu embedding process is carried out to embed Cu (copper) in the penetration connection hole 61 and the connection hole 62 by adoption of the electrolytic-plating method. The Cu (copper) embedded in the penetration connection hole 61 and the connection hole 62 serves as the penetration connection conductor 64 and the connection conductor 65 respectively.

As described above, in the processing to embed connection conductors into a plurality of connection holes having aspect ratios different from each other, an anchor process is carried out to form the barrier metal film 81 and to perform physical etching, which makes use of argon gas, at the same time. The connection holes are the penetration connection hole 61 and the connection hole 62. The physical etching is also referred to as inverse sputtering. In the anchor process, the boring quantity of the via bottom of the penetration connection hole 61 serving as a high-AR via can be set at a large value whereas the boring quantity of the via bottom of the connection hole 62 serving as a low-AR via can be set at a small value. In the following description, the boring quantity is also referred to as an etching quantity. Thus, at the via bottom of each of the connection holes having aspect ratios different from each other, a stable electrical resistance can be obtained.

Configuration of Chamber for Anchor Process

Figure 16:
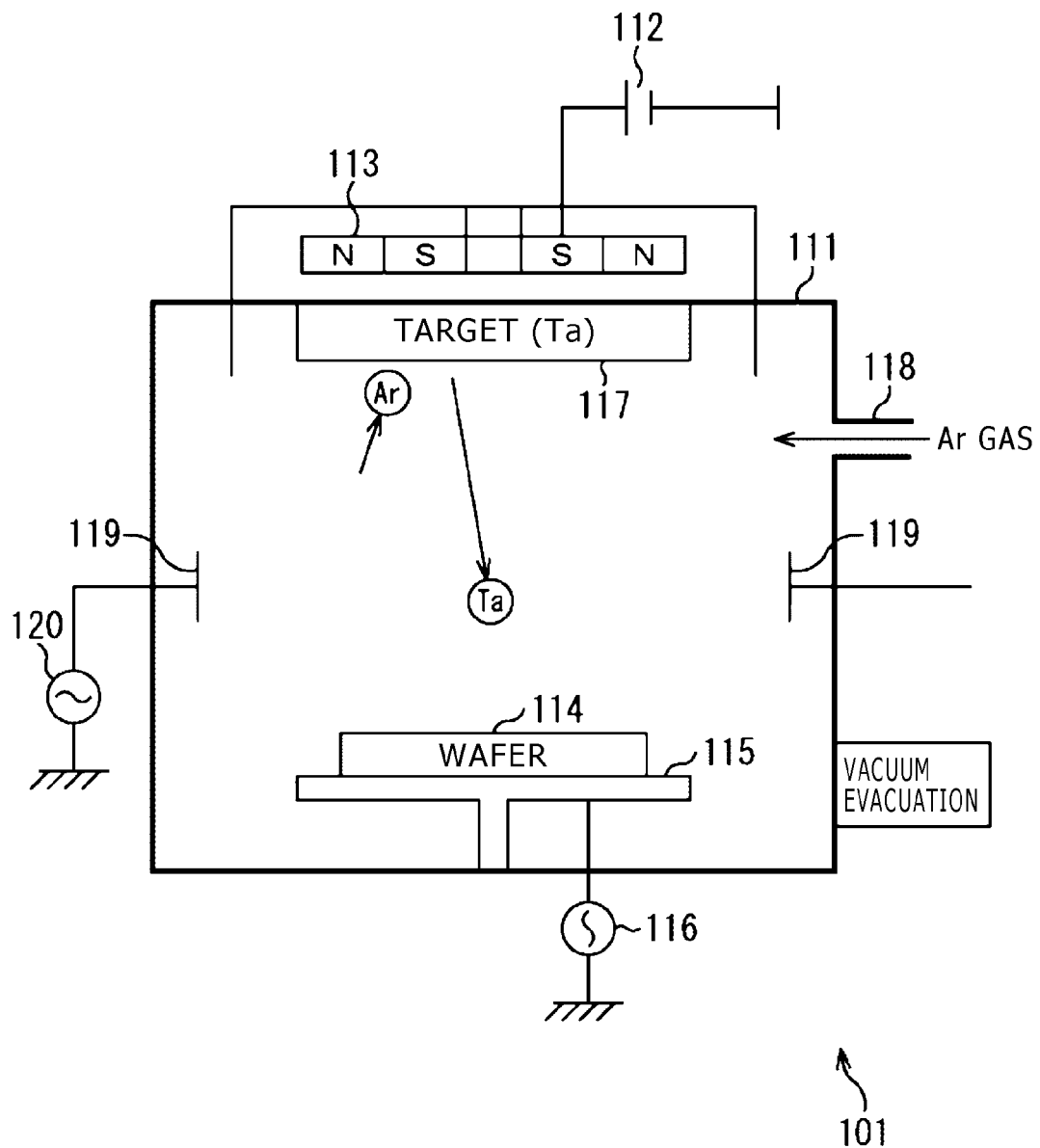
FIG. 16 is an explanatory diagram to be referred to in description of the configuration of a chamber for carrying out anchor processing.

FIG. 16 is an explanatory diagram referred to in the following description of the configuration of the chamber 111 employed in a sputter apparatus 101 for carrying out the anchor process.

On the chamber 111 employed in the sputter apparatus 101, a strong magnetic field cathode magnet 113 connected to target DC (direct current) power supply 112 is mounted so that low-voltage remote ionization sputtering can be carried out. In addition, the chamber 111 has a substrate stage 115 connected to a stage bias power supply 116. Thus, on the chamber 111, a high-frequency bias application mechanism is included. On the substrate stage 115, a wafer 114 is mounted. The wafer 114 is the junction substrate of the first semiconductor substrate 31 and the second semiconductor substrate 45.

In the sputter apparatus 101 having the chamber 111 described above, it is possible to adjust the etching quantity of the etching process making use of argon ions by controlling the power supplied by the stage bias power supply 116. In addition, it is also possible to adjust the discharge quantity of a target (Ta) 117 by controlling the power supplied by the target DC power supply 112.

In addition, the chamber 111 is also provided with an ICP (Inductively Coupled Plasma) antenna 119 for promoting ionization of Ar (argon) gas supplied by a sputter-gas supplying section 118 separately from a barrier metal sputter film discharged by the target (Ta) 117. The ICP antenna 119 is connected to an ICP power supply 120. It is thus possible to simultaneously control the process of forming the barrier metal film (Ta) and the quantity of the physical etching making use of argon ions.

In general, when a process of forming a film is carried out by adoption of the PVD (Physical Vapor Deposition) method, the coverage rate of the sputter film (Ta) decreases in accordance with the aspect ratio. On the other hand, the argon ions are attracted by the substrate bias to the via bottom so that the dependence of the etching speed on the aspect ratio is small.

In this case, the sputter apparatus 101 having the structure shown in FIG. 16 carries out the anchor process. That is to say, the sputter apparatus 101 simultaneously carries out the process of forming the barrier metal film 81 also referred to as a Ta film and the etching process making use of argon ions. By carrying out the process of forming the barrier metal film 81 and the etching process at the same time, at the via bottom of the penetration connection hole 61 serving as a high-AR via, the etching process is carried forward. At the via bottom of the connection hole 62 serving as a low-AR via, however, the barrier metal film 81 is formed without carrying out the etching process. Thus, it is possible to carry out processes optimum for the penetration connection hole 61 and the connection hole 62 having aspect ratios different from each other.

Figure 17A:
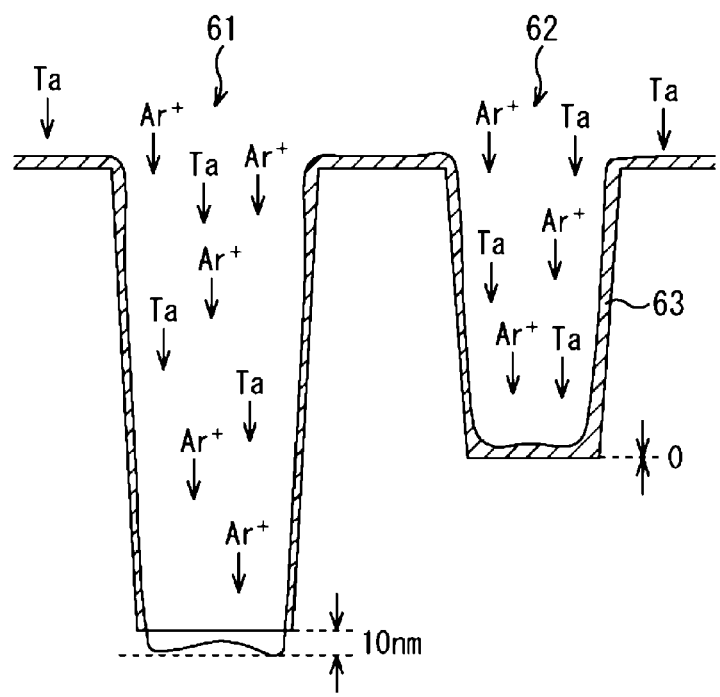
FIGS. 17A and 17B are explanatory diagrams to be referred to in description of typical concrete set values of the anchor processing.

Next, by referring to FIGS. 17A to 18, the following description explains typical concrete examples of set values for the anchor process. However, the concrete examples of set values for the anchor process are no more than typical. That is to say, it is a matter of course that an optimum set value of a connection hole varies in accordance with the aspect ratio of the hole.

FIG. 17A is a diagram showing a typical example of setting the boring quantity of the via bottom of the penetration connection hole 61 serving as a high-AR via at a minimum value. In this typical example, the boring quantity of the via bottom of the penetration connection hole 61 serving as a high-AR via is set at 10 nm whereas the boring quantity of the via bottom of the connection hole 62 serving as a low-AR via is set at 0 nm.

In the case of the boring quantities like the ones shown in FIG. 17A, the anchor process can be implemented, for example, by setting the pressure of the argon gas at a value in a range of 0.1 Pa to 0.3 Pa, the power output by the target DC power supply 112 at 500 W and the power output by the stage bias power supply 116 at 300 W.

Figure 17B:
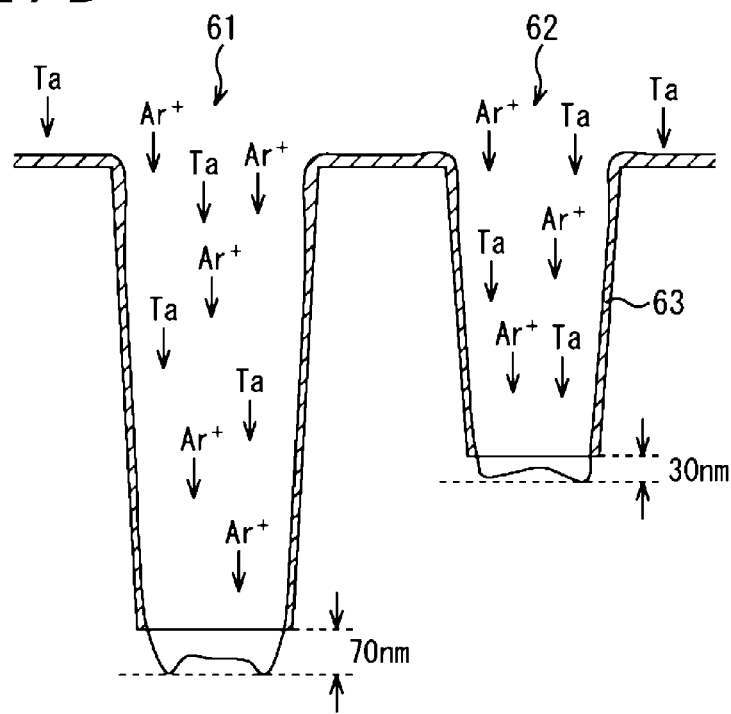

On the other hand, FIG. 17B is a diagram showing a typical example of setting the boring quantity of the via bottom of the penetration connection hole 61 serving as a high-AR via at a maximum value and setting the boring quantity of the via bottom of the connection hole 62 serving as a low-AR via at a constant value. To be more specific, in this typical example, the boring quantity of the via bottom of the penetration connection hole 61 serving as a high-AR via is set at 70 nm whereas the boring quantity of the via bottom of the connection hole 62 serving as a low-AR via is set at 30 nm.

In the case of the boring quantities like the ones shown in FIG. 17B, the anchor process can be implemented, for example, by setting the pressure of the argon gas at a value in a range of 0.1 Pa to 0.3 Pa, the power output by the target DC power supply 112 at 500 W and the power output by the stage bias power supply 116 at 1,000 W.

As described above, it is desirable that, in the solid-state imaging apparatus 1, the boring quantity of the via bottom of the penetration connection hole 61 serving as a high-AR via is set at a value in a range of 10 nm to 70 nm whereas the boring quantity of the via bottom of the connection hole 62 serving as a low-AR via is set at a value in a range of 0 nm to 30 nm.

As described above, by controlling the power output by the stage bias power supply 116, the etching quantity can be adjusted and, by controlling the power output by the target DC power supply 112, it is possible to adjust the thickness of the barrier metal film 81 which is also referred to as a Ta film. FIG. 18 is a diagram showing an optimum set-value range on the horizontal axis representing the ratio of the power output by the stage bias power supply 116 to the power output by the target DC power supply 112.

The phrase "Stage bias power/DC power" shown in FIG. 18 is the ratio of the power output by the stage bias power supply 116 to the power output by the target DC power supply 112. If this power ratio is set at a value in an optimum set-value range shown in the figure as a range of 0.5 to 2.0, it is possible to carry out processing optimum for the penetration connection hole 61 serving as a high-AR via and the connection hole 62 serving as a low-AR via. It is to be noted that, in the barrier metal film formation process carried out after the anchor process, the power output by the stage bias power supply 116 can be reduced in order to perform only a process of forming the barrier metal film 81.

As described above, the solid-state imaging apparatus 1 is manufactured by bonding the first semiconductor substrate 31 and the second semiconductor substrate 45 to each other and by reducing the thickness of the first semiconductor substrate 31. Variations of the thickness of a substrate including two semiconductor substrates not bonded to each other are caused by only variations of the thickness of the inter-layer film. On the other hand, variations of the thickness of a final substrate including two semiconductor substrates bonded to each other are caused by variations of the thickness of the inter-layer film and variations generated in the process of reducing the thickness of the final substrate. Thus, variations of the depth of the penetration connection hole 61 created after the bonding process to serve as a high-AR via are large. Therefore, post-fabrication residues are difficult to control. In order to solve this problem, there is provided a useful physical elimination process of obtaining a cleansed boundary face. In particular, if the penetration connection hole 61 serving as a high-AR via is created at the same time as the connection hole 62 serving as a low-AR via, an effort made to prevent an excessive fabrication processing from being carried out on the connection hole 62 raises problems including insufficient fabrication of the penetration connection hole 61 serving as a high-AR via. In order to solve these problems, there is provided a useful aperture process to be carried out by adopting the physical elimination method.

Example of Making Top Layer of Wires from Aluminum

Figure 19:
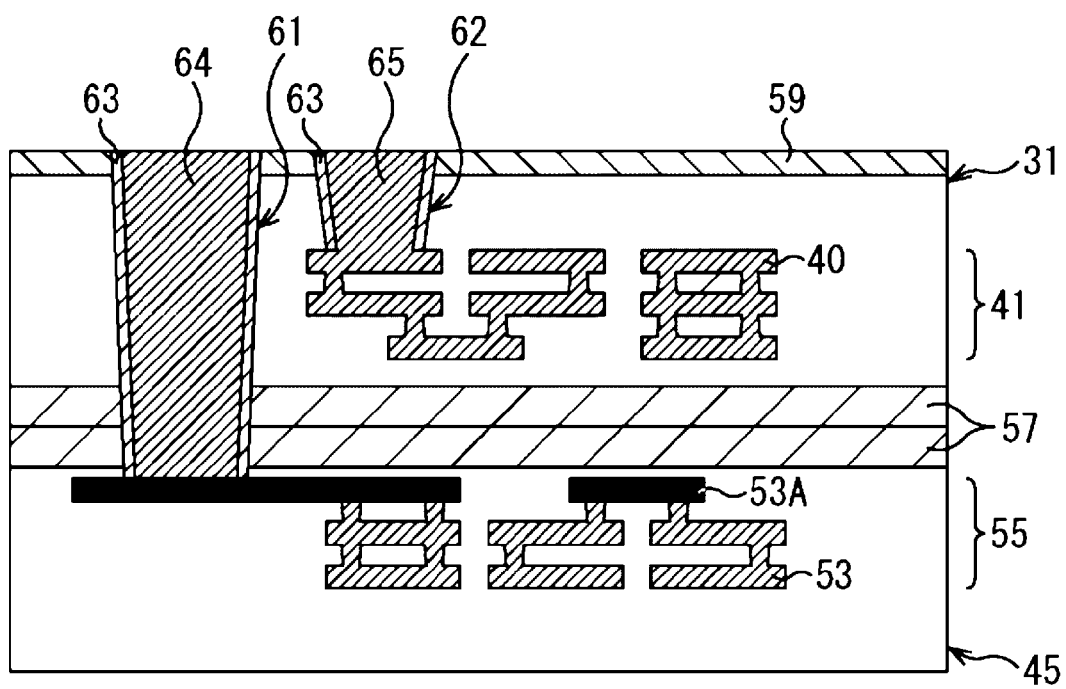
FIG. 19 is a diagram showing an embodiment having a different wire material.

In the example described above, the wires 40 and 53 of the multi-layer wiring layers 41 and 55 are made of Cu (copper). In general, however, a number of easily obtainable semiconductor substrates are substrates having a wiring structure including a top-layer wire made of Al (aluminum) serving as a mother material. That is to say, an embodiment shown in FIG. 19 is an example in which the top-layer wire 53A of the second semiconductor substrate 45 is a wire made of Al.

If the wire 53A of the via bottom of the penetration connection hole 61 is an Al wire, on the surface of the Al wire 53A, an Al-oxide layer is created due to natural oxidation. If a reduction process performed by making use of hydrogen gas for a Cu-oxide layer created due to natural oxidation of a Cu wire is carried out for the Al-oxide layer, an effect of the reduction process cannot be obtained. For this reason, an etching process making use of physical sputter is absolutely required. Thus, if the penetration connection hole 61 and the connection hole 62 have aspect ratios different from each other and the wire 53A of the via bottom of the penetration connection hole 61 having a high aspect ratio is an Al wire, the execution of the anchor process described above provides a good effect.

Connection-Hole Creating Processes of Penetration Connection Holes and Connection Holes Next, by referring to FIGS. 20A to 20F, the following description explains details of the connection-hole creating processes carried out at the step S1 to create the penetration connection hole 61 and the connection hole 62.

In a first process, after the entire surface of the inter-layer insulation film 59 has been coated with a resist 201, as shown in FIG. 20A, an aperture is created on the resist 201 in an area corresponding to the connection hole 62 serving as a low-AR via. As described earlier, the inter-layer insulation film 59 is a film on the side of the rear surface 31b of the first semiconductor substrate 31 in a state shown in FIG. 8.

Then, in a second process, as shown in FIG. 20B, at a position adjusted to the aperture area of the resist 201, the first semiconductor substrate 31 is etched in order to create the connection hole 62 which attains the wire 40 of the first layer. After the connection hole 62 has been created, the resist 201 completing a patterning process is removed.

Then, in a third process, as shown in FIG. 20C, a resist 202 is subjected to a patterning process on the side of the rear surface 31b of the first semiconductor substrate 31 in order to create an aperture in an area corresponding to the penetration connection hole 61 serving as a high-AR via.

Then, in a fourth process, as shown in FIG. 20D, at a position adjusted to the aperture area of the resist 202, the first semiconductor substrate 31 is etched in order to create the penetration connection hole 61 which reaches the top-layer wire 53 of the second semiconductor substrate 45 by penetrating the first semiconductor substrate 31. After the penetration connection hole 61 has been created, the resist 202 completing a patterning process is removed.

Then, in a fifth process, as shown in FIG. 20E, on a surface including the surfaces of inner walls of the penetration connection hole 61 and the connection hole 62, the insulation film 63 for electrical insulation from the first semiconductor substrate 31 is created.

Finally, in a sixth process, as shown in FIG. 20F, the insulation film 63 is removed from the via bottoms of the penetration connection hole 61 and the connection hole 62 to result in the state shown in FIG. 9.

As described above, the penetration connection hole 61 and the connection hole 62 are created at the step S1.

Second Embodiment of Penetration Connection Holes and Connection Holes

In this embodiment, as explained earlier by referring to FIG. 11, the connection wire 72 is created on the first semiconductor substrate 31 by sandwiching the barrier metal film 71 between the first semiconductor substrate 31 and the connection wire 72 which is an aluminum layer. The connection wire 72 connects the penetration connection conductor 64 of the penetration connection hole 61 to the connection conductor 65 of the connection hole 62.

Figure 21:
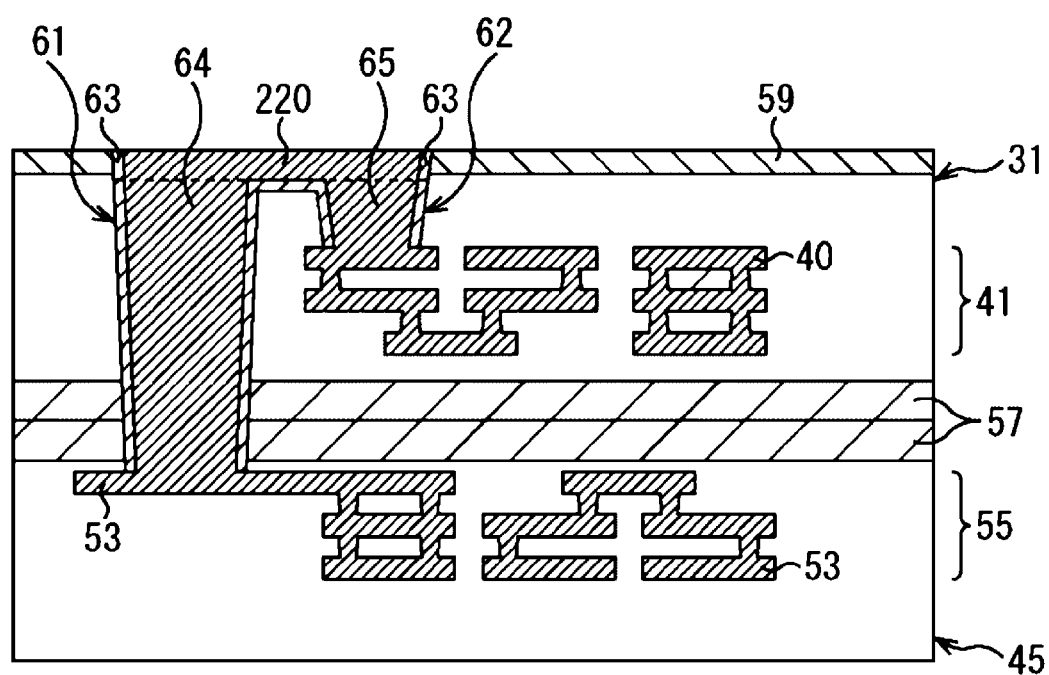
FIG. 21 is an explanatory diagram to be referred to in description of a second embodiment of a penetration connection hole and a connection hole.

As shown for example in FIG. 21, however, an inter-via wire 220 can also be created in the first semiconductor substrate 31 to connect the penetration connection conductor 64 of the penetration connection hole 61 to the connection conductor 65 of the connection hole 62.

That is to say, FIG. 21 shows a second embodiment of the penetration connection hole 61 and the connection hole 62 which have aspect ratios different from each other.

First Method for Manufacturing Second Embodiment of Penetration Connection Holes and Connection Holes Next, by referring to FIGS. 22A to 22G, the following description explains a first method for manufacturing the second embodiment shown in FIG. 21 as another embodiment of the penetration connection hole 61 and the connection hole 62.

Figure 22:
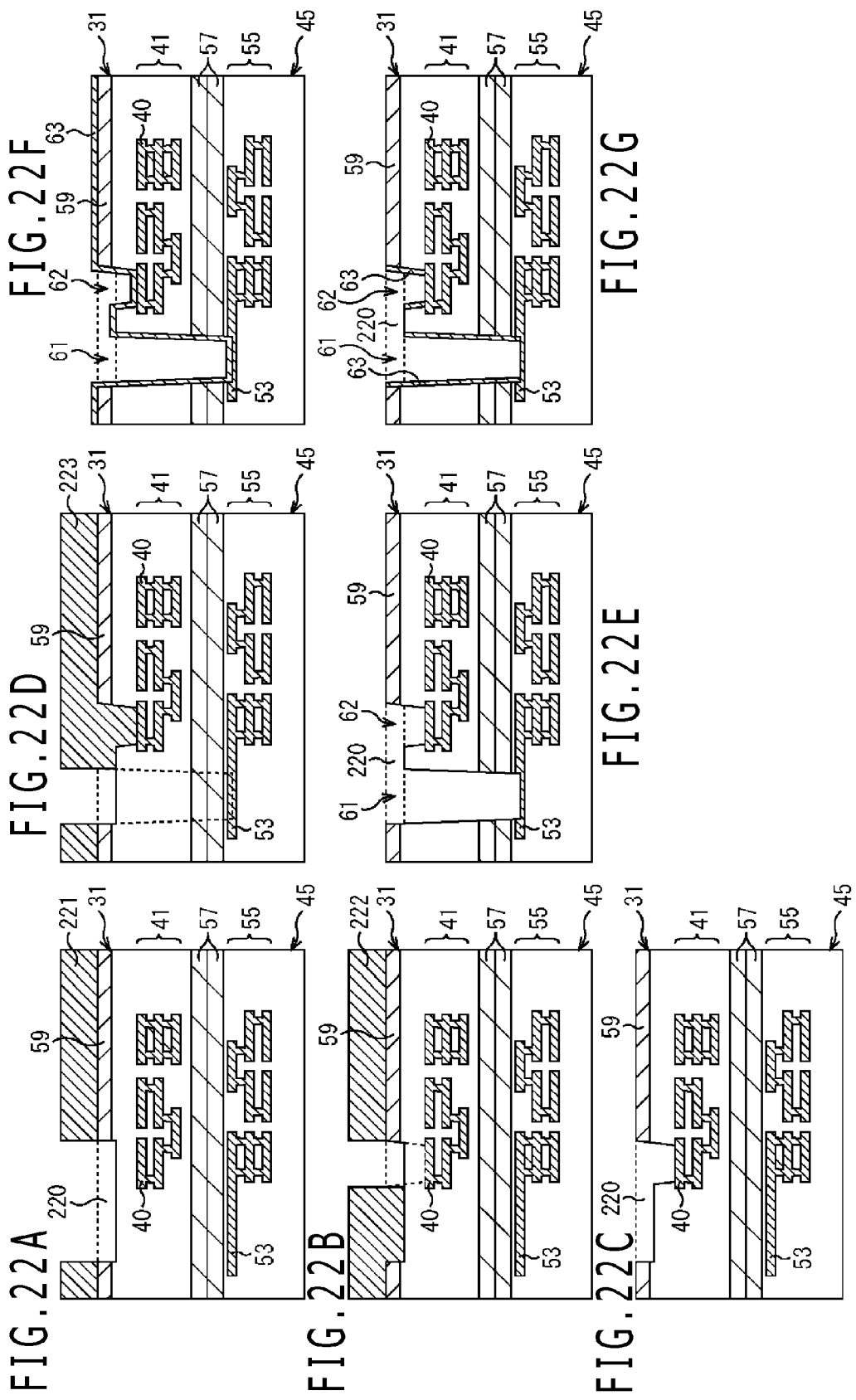
FIGS. 22A to 22G are explanatory diagrams to be referred to in description of a first creation method according to the second embodiment.

In a first process, as shown in FIG. 22A, a resist 221 is subjected to a patterning process and an etching process to a depth determined in advance in order to create an aperture in an area corresponding to the inter-via wire 220 on the side of the rear surface 31b of the first semiconductor substrate 31.

Then, in a second process, as shown in FIG. 22B, a resist 222 is subjected to a patterning process so as to create an aperture only in an area of the connection hole 62 serving as a low-AR via. Subsequently, the first semiconductor substrate 31 is subjected to an etching process at a position adjusted to the aperture area of the resist 222. Then, as shown in FIG. 22C, after the connection hole 62 has been created to attain the wire 40 of the first layer, the resist 222 completing the patterning process is removed.

Then, in a third process, as shown in FIG. 22D, a resist 223 is subjected to a patterning process on the inter-layer insulation film 59 on the side of the rear surface 31b of the first semiconductor substrate 31 so as to create an aperture only in an area corresponding to the penetration connection hole 61 serving as a high-AR via.

Then, in a fourth process, as shown in FIG. 22E, the first semiconductor substrate 31 is subjected to an etching process at a position adjusted to the aperture area of the resist 223 in order to create the penetration connection hole 61 which reaches the top-layer wire 53 of the second semiconductor substrate 45 by penetrating the first semiconductor substrate 31. After the penetration connection hole 61 has been created, the resist 223 completing the patterning process is removed.

Then, in a fifth process, as shown in FIG. 22F, on a surface including the surfaces of inner walls of the penetration connection hole 61 and the connection hole 62, the insulation film 63 is created.

Finally, in a sixth process, as shown in FIG. 22G, the insulation film 63 is removed from the via bottoms of the penetration connection hole 61 and the connection hole 62 to result in the state shown in FIG. 21.

Second Method for Manufacturing Second Embodiment of Penetration Connection Holes and Connection Holes Next, by referring to FIGS. 23A to 23E, the following description explains a second method for manufacturing the second embodiment shown in FIG. 21 as another embodiment of the penetration connection hole 61 and the connection hole 62.

Figure 23:
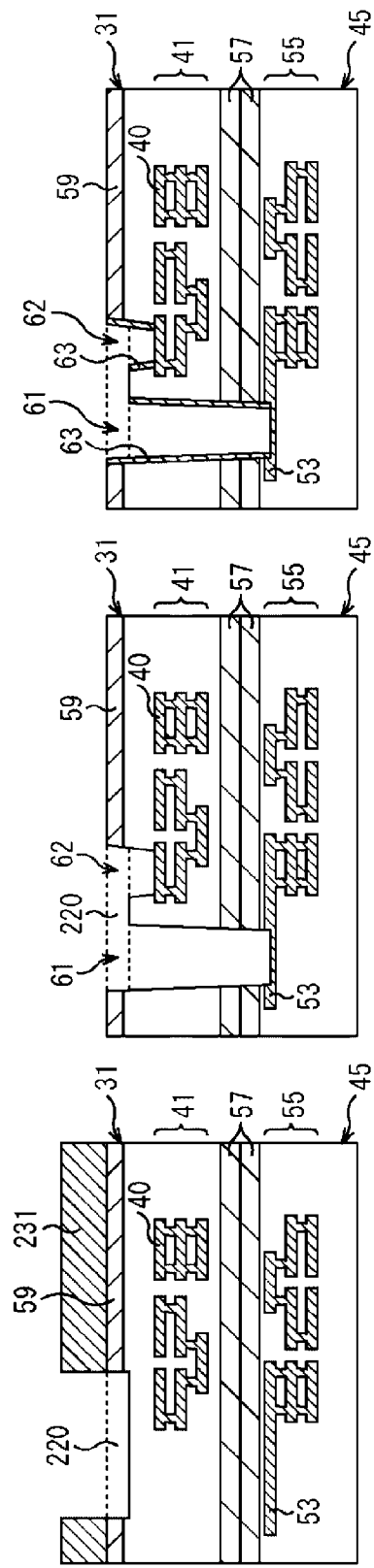
FIGS. 23A to 23E are explanatory diagrams to be referred to in description of a second creation method according to the second embodiment.

In a first process, as shown in FIG. 23A, a resist 231 is subjected to a patterning process and an etching process to a depth determined in advance in order to create an aperture in an area corresponding to a inter-via wire 220 on the side of the rear surface 31b of the first semiconductor substrate 31.

Then, in a second process, as shown in FIG. 23B, a resist 232 is subjected to a patterning process so as to create apertures in areas corresponding to both the penetration connection hole 61 and the connection hole 62. Subsequently, as shown in FIG. 23C, the first semiconductor substrate 31 is subjected to an etching process at positions adjusted to the aperture areas of the resist 232 in order to create the connection hole 62 and the penetration connection hole 61 at the same time. Then, after the connection hole 62 and the penetration connection hole 61 have been created, the resist 232 completing the patterning process is removed.

Then, in a third process, as shown in FIG. 23D, on a surface including the surfaces of inner walls of the penetration connection hole 61 and the connection hole 62, the insulation film 63 is created.

Finally, in a fourth process, as shown in FIG. 23E, the insulation film 63 is removed from the via bottoms of the penetration connection hole 61 and the connection hole 62 to result in the state shown in FIG. 21.

It is thus obvious that the anchor process explained before is effective also for the second embodiment devised as described above to implement the penetration connection hole 61 and the connection hole 62.

Third Embodiment of Penetration Connection Holes and Connection Holes

Figure 24:
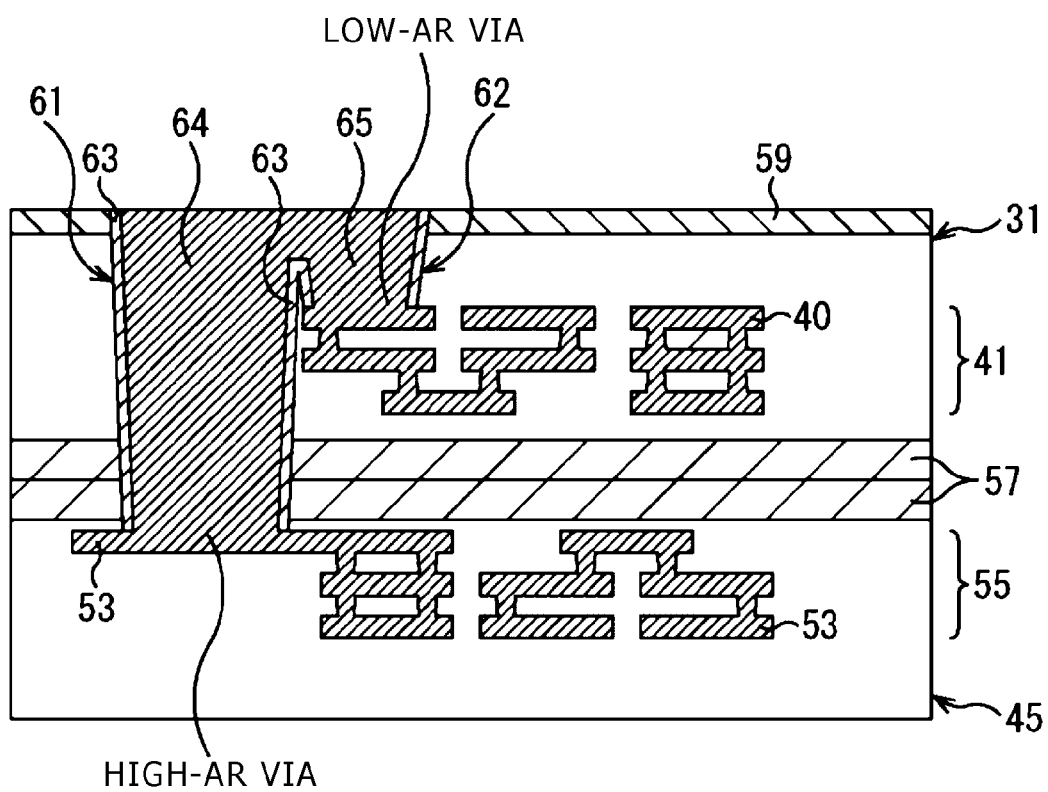
FIG. 24 is an explanatory diagram to be referred to in description of a third embodiment of a penetration connection hole and a connection hole.

FIG. 24 is an explanatory diagram referred to in the following description of a third embodiment of a penetration connection hole 61 and a connection hole 62 which have aspect ratios different from each other.

In the case of the third embodiment shown in FIG. 24, the penetration connection hole 61 and the connection hole 62 are connected to each other directly without making use of a connection wire.

Method for Manufacturing Third Embodiment of Penetration Connection Holes and Connection Holes Next, by referring to FIGS. 25A to 25D, the following description explains a method for manufacturing the third embodiment shown in FIG. 24 as a further embodiment of the penetration connection hole 61 and the connection hole 62.

Figure 25A:
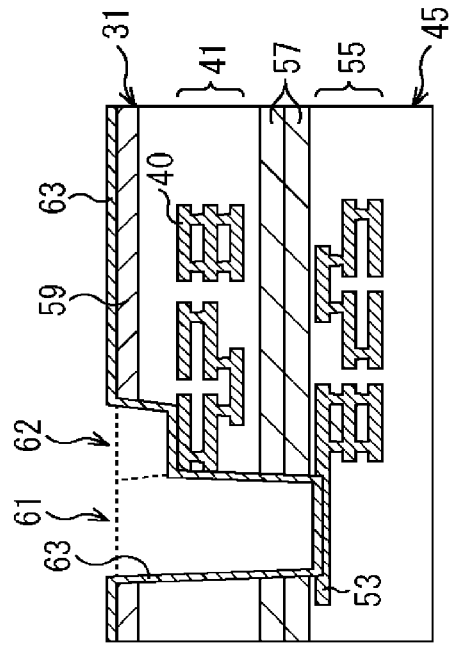
FIGS. 25A to 25D are explanatory diagrams to be referred to in description of a creation method according to the third embodiment.

In a first process, as shown in FIG. 25A, a resist 241 is subjected to a patterning process in order to create apertures in areas corresponding to both the penetration connection hole 61 and the connection hole 62 on the side of the rear surface 31b of the first semiconductor substrate 31.

Figure 25C:
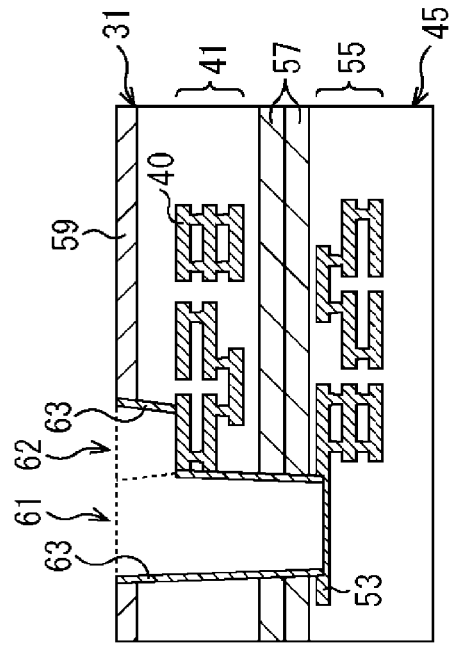
Figure 25B:
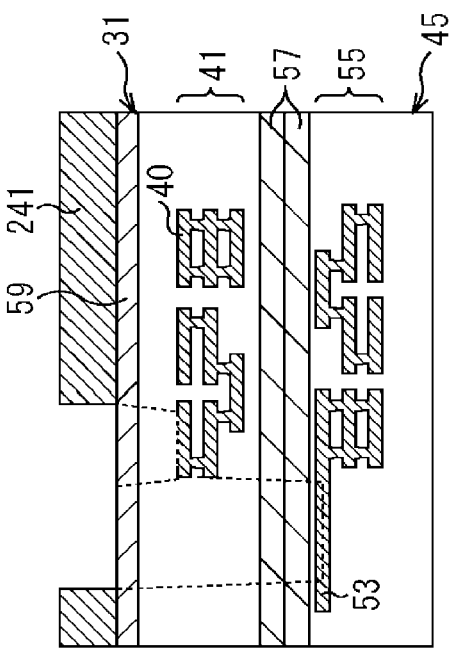

Then, in a second process, as shown in FIG. 25B, the first semiconductor substrate 31 is subjected to an etching process to a depth determined in advance in order to create the penetration connection hole 61 and the connection hole 62 at the same time.

Then, in a third process, as shown in FIG. 25C, on a surface including the surfaces of inner walls of the penetration connection hole 61 and the connection hole 62, the insulation film 63 is created.

Figure 25D:
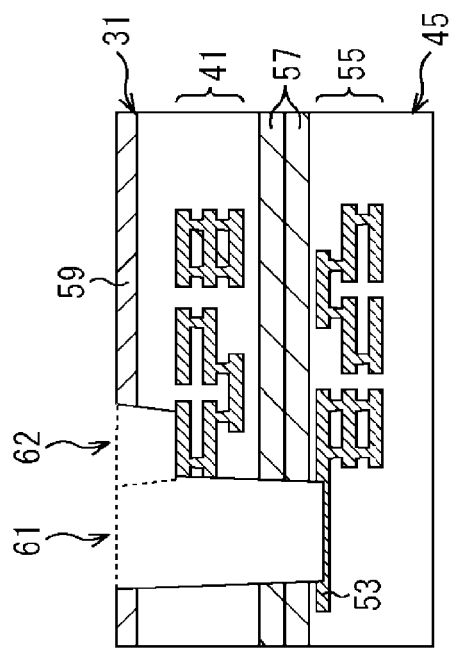

Finally, in a fourth process, as shown in FIG. 25D, the insulation film 63 is removed from the via bottoms of the penetration connection hole 61 and the connection hole 62 to result in the state shown in FIG. 24.

It is thus obvious that the anchor process explained before is effective also for the third embodiment devised as described above to implement the penetration connection hole 61 and the connection hole 62.

Other Embodiments Having Different Aspect Ratios

The above descriptions have explained a variety of embodiments each including the penetration connection hole 61 and the connection hole 62 which have aspect ratios different from each other. However, applications of the present technology are by no means limited to processing carried out on connections holes having aspect ratios different from each other. That is to say, the present technology can also be applied to processing carried out on the surfaces of wires connected to the lower portions of penetration connection holes and the surfaces of wires connected to the lower portions of apertures having an aspect ratio different from that of the penetration connection holes. Thus, the present technology makes it possible to carry out processing optimum for the surfaces of the wires connected to the lower portions of the penetration connection holes and the apertures.

Figure 26A:
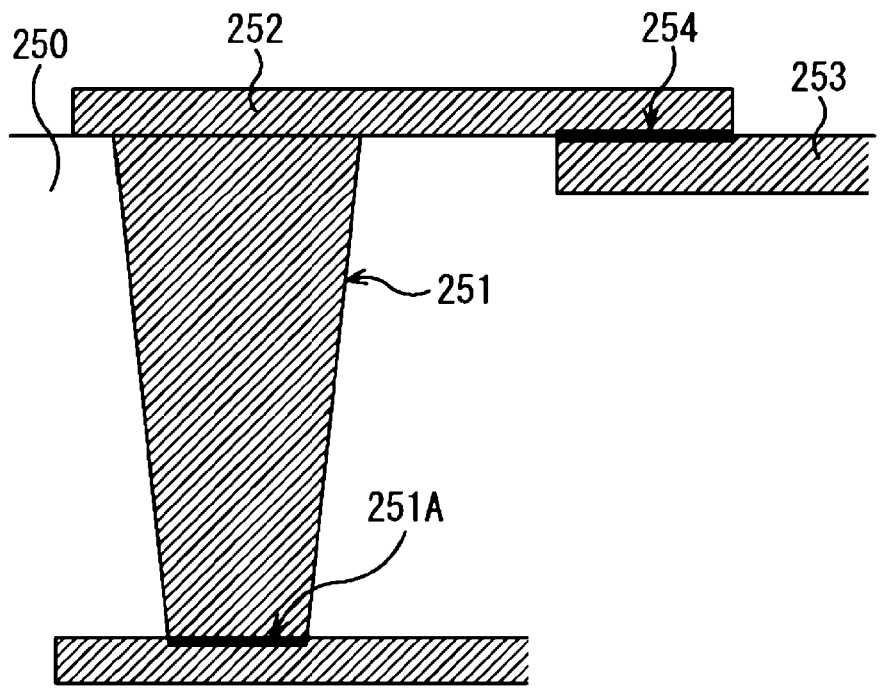
FIGS. 26A and 26B are explanatory diagrams to be referred to in description of another embodiment having different aspect ratios.
Figure 26B:
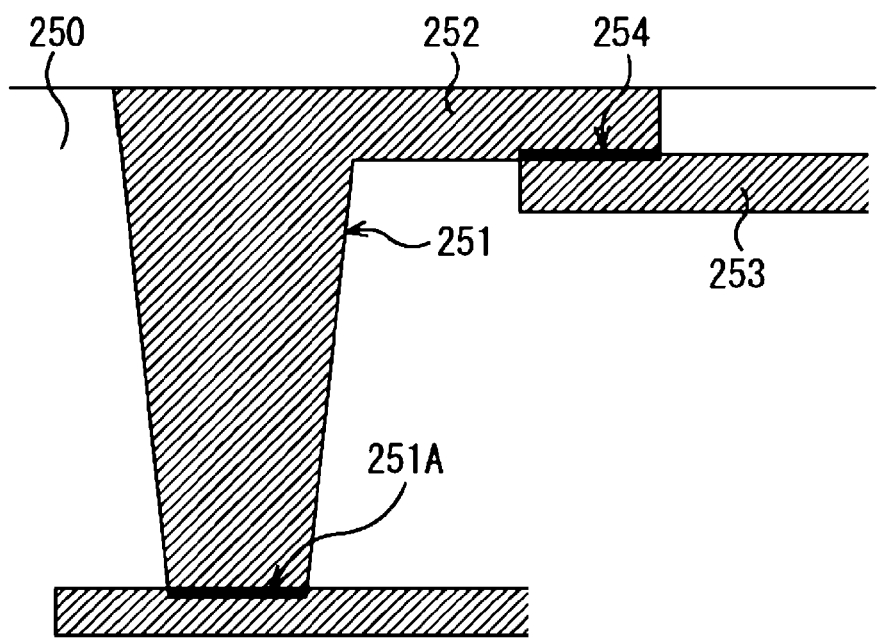

As shown in FIGS. 26A and 26B for example, a penetration connection hole 251 of a semiconductor substrate 250 is connected to a wiring layer 253 of the semiconductor substrate 250 by making use of a connection wire 252. For such a configuration, the present technology can be applied to processing carried out at the same time on the bottom 251A of the penetration connection hole 251 and the connection face 254 between the connection wire 252 and the wiring layer 253. In this case, the connection wire 252 can be made of a material such as Cu (copper), W (tungsten) or Al (aluminum). If the connection wire 252 is made of Al, TiN or the like is used for making the cap film. If the connection wire 252 is made of Cu, the material used for forming a film in the anchor process can be Ta (tantalum), Ti (titanium), Zr (zirconium), Ru (ruthenium) or their alloy. If the connection wire 252 is made of W or Al, on the other hand, the material used for forming a film in the anchor process can be Ti, TiN or the like.

Figure 27:
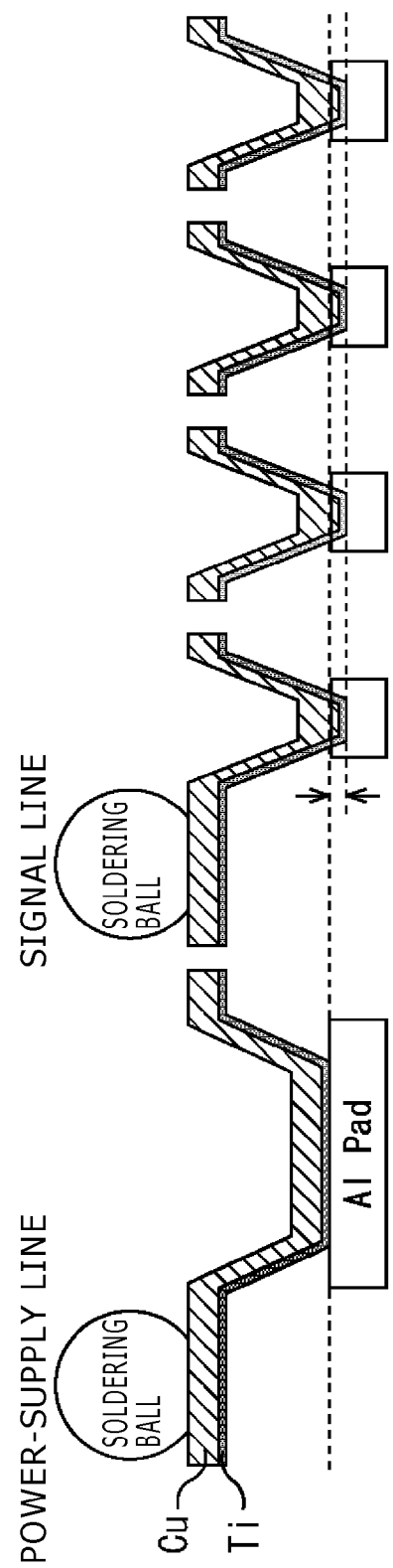
FIG. 27 is an explanatory diagram to be referred to in description of a further embodiment having different aspect ratios.

In addition, the present technology can also be applied to processing carried out for a plurality of connection holes having the same height but having aspect ratios different from each other. FIG. 27 is an explanatory diagram showing a structure of bumps for drawing power or signals from pad sections according to a further embodiment including a plurality of connection holes having the same height but having aspect ratios different from each other.

In general, a drawing circuit includes a power-supply line and a signal line. The power supply line has a large electrical capacitance and it is desirable to reduce the line resistance as well as the via resistance. Thus, it is desirable to provide the power supply line with a relatively large contact area. On the other hand, the signal line has a small electrical capacitance but it is desirable to make use of a number of such signal lines. Thus, it is desirable to create fine bumps and, therefore, reduce the contact area. Accordingly, as shown in FIG. 27, for the power-supply line, a bump structure provided with a large contact area is adopted as is the case with the structure for a low-AR connection hole. For the signal line, on the other hand, a bump structure provided with a small contact is adopted as is the case with the structure for a high-AR connection hole.

In a fabrication process of creating these bumps at the same time, in the case of a bump having a large area, the cleanness of a post-fabrication pad-connection boundary face is easy to obtain. In the case of a bump having a small area, on the other hand, a stable and clean state is difficult to obtain. This is because a number of fine bumps each having a small area are provided. In order to solve this problem, the present technology described above provides the anchor process which allows processing optimum for each of the low-AR via and the high-AR via to be carried out by changing the boring quantities of the low-AR via and the high-AR via so that a stable contact resistance can be obtained even if the bump metals are created at the same time. It is to be noted that the structure having a large contact area of also a line other than the power-supply line can be a drawing structure for dissipating heat.

The above descriptions are summarized as follows. The anchor process based on the present technology can be applied to processing carried out on the surface of the wire connected to the lower portion of each a plurality of apertures having aspect ratios different from each other. In this case, the apertures include connection holes. The anchor process is particularly effective for a case in which the difference between the aspect ratios is not smaller than two times and the diameter of the contact has a value in a range of 1 micron to 100 microns. The diameter of the contact is also referred to as an aperture.

Typical Applications to Electronic Equipment

The solid-state imaging apparatus 1 described above can be applied to a variety of equipment including an imaging apparatus such as a digital still camera and a digital video camera, a mobile phone having an imaging function and other equipment each having an imaging function, to mention a few.

Figure 28:
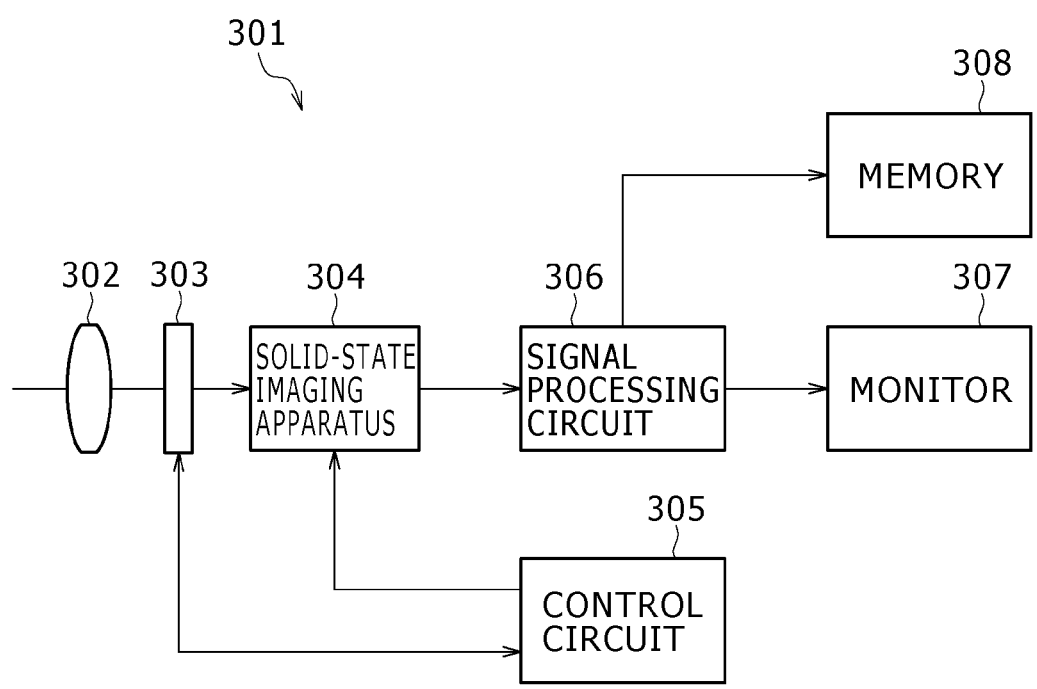
FIG. 28 is a block diagram showing a typical configuration of an imaging apparatus serving as a piece of electronic equipment to which the present technology is applied.

FIG. 28 is a block diagram showing a typical configuration of an imaging apparatus 301 serving as a piece of electronic equipment to which the present technology is applied.

The imaging apparatus 301 shown in FIG. 28 is configured to include an optical system 302, a shutter apparatus 303, a solid-state imaging apparatus 304, a control circuit 305, a signal processing circuit 306, a monitor 307 and a memory 308. The imaging apparatus 301 is capable of taking still and moving images.

The optical system 302 is configured to employ a lens or a plurality of lenses. The optical system 302 guides incident light coming from a photographing object to the solid-state imaging apparatus 304. The light thus hits the light receiving surface of the solid-state imaging apparatus 304.

The shutter apparatus 303 is placed at a position between the optical system 302 and the solid-state imaging apparatus 304. In accordance with a driving signal output by the control circuit 305, the solid-state imaging apparatus 304 controls the light-radiation and light-blocking periods of the light propagating from the optical system 302 to the solid-state imaging apparatus 304 by way of the shutter apparatus 303.

The solid-state imaging apparatus 304 is the solid-state imaging apparatus 1 described above. The solid-state imaging apparatus 304 accumulates signal electric charge during a fixed period in accordance with light propagating through the optical system 302 and the shutter apparatus 303 and arriving at the solid-state imaging apparatus 304. From the light, an image is formed on the light receiving surface of the solid-state imaging apparatus 304. The signal electric charge accumulated in the solid-state imaging apparatus 304 is transferred to the signal processing circuit 306 in accordance with a driving signal also referred to as a timing signal supplied by the control circuit 305. The solid-state imaging apparatus 304 can be implemented as a chip consisting of the solid-state imaging apparatus 304 only. As an alternative, the solid-state imaging apparatus 304 can also be implemented as a portion of a camera module which is a package also including the other components ranging from the optical system 302 to the signal processing circuit 306.

The control circuit 305 drives the solid-state imaging apparatus 304 and the shutter apparatus 303. To put it concretely, the control circuit 305 generates driving signals for controlling the operation carried out by the solid-state imaging apparatus 304 to transfer the signal electric charge to the signal processing circuit 306 and the shutter operation carried out by the shutter apparatus 303.

The signal processing circuit 306 carries out various kinds of signal processing on the signal electric charge received from the solid-state imaging apparatus 304. Image data obtained as a result of the signal processing carried out by the signal processing circuit 306 is supplied to the monitor 307 for displaying an image based on the data. The image data is also supplied to the memory 308 used for storing or recording the data.

The embodiments described above are each an example in which the present technology is applied to the solid-state imaging apparatus. However, applications of the present technology are by no means limited to the solid-state imaging apparatus. That is to say, the present technology can also be applied to a variety of semiconductor apparatus such as a memory device and a multi-function device. In other words, the present technology can also be applied to a semiconductor apparatus which is configured to employ first and second semiconductor substrates pasted on each other and is provided with at least a penetration connection hole penetrating the first semiconductor substrate and reaching the second semiconductor substrate.

In addition, implementations of the present technology are by no means limited to the embodiments described above. That is to say, the embodiments described above can be changed in a variety of ways within a range not deviating from essentials of the present technology.

It is to be noted that the present technology can also be realized into the following implementations:

1. A method for manufacturing a semiconductor apparatus, including
a first process of forming a barrier metal film and carrying out physical etching making use of sputter gas to serve as a process to be carried out at the same time on wires connected to the lower portions of first and second apertures created on a semiconductor substrate obtained by bonding first and second semiconductor substrates to each other to serve as first and second apertures having aspect ratios different from each other.

2. The method for manufacturing a semiconductor substrate in accordance with implementation 1
wherein the first aperture is a penetration connection hole penetrating the first semiconductor substrate whereas the second aperture is a connection hole in the first semiconductor substrate.

3. The method for manufacturing a semiconductor substrate in accordance with implementation 1
wherein the first and second apertures are connection holes having heights equal to each other and aspect ratios different from each other.

4. The method for manufacturing a semiconductor substrate in accordance with any one of implementations 1 to 3, the method further including a second process carried out after the first process in the same chamber as the first process only to form the barrier metal film.

5. A semiconductor apparatus manufactured by adoption of a manufacturing method including a process of forming a barrier metal film and carrying out physical etching making use of sputter gas to serve as a process to be carried out at the same time on wires connected to the lower portions of first and second apertures created on a semiconductor substrate obtained by bonding first and second semiconductor substrates to each other to serve as first and second apertures having aspect ratios different from each other.

6. Electronic equipment including a semiconductor apparatus manufactured by adoption of a manufacturing method including a process of forming a barrier metal film and carrying out physical etching making use of sputter gas to serve as a process to be carried out at the same time on wires connected to the lower portions of first and second apertures created on a semiconductor substrate obtained by bonding first and second semiconductor substrates to each other to serve as first and second apertures having aspect ratios different from each other.

The present disclosure contains subject matter related to that disclosed in Japanese Priority Patent Application JP 2011-261331 filed in the Japan Patent Office on Nov. 30, 2011, the entire content of which is hereby incorporated by reference.

What is claimed is:

1. A method for manufacturing a semiconductor apparatus, comprising:

a first process of forming a barrier metal film and carrying out physical etching making use of sputter gas to serve as a process to be carried out at the same time on wires connected to lower portions of first and second apertures created on a semiconductor substrate obtained by bonding first and second semiconductor substrates to each other to serve as first and second apertures having aspect ratios different from each other; and after forming a barrier metal layer and carrying out physical etching, carrying out a seed film formation process to form a seed layer on surfaces of the first and second apertures.

2. The method for manufacturing a semiconductor apparatus, according to claim 1 wherein said first aperture is a penetration connection hole penetrating said first semiconductor substrate whereas said second aperture is a connection hole in said first semiconductor substrate.

3. The method for manufacturing a semiconductor apparatus, according to claim 1 wherein said first and second apertures are connection holes having heights equal to each other and aspect ratios different from each other.

4. The method for manufacturing a semiconductor substrate, according to claim 1, further comprising a second process carried out after said first process in the same chamber as said first process only to form said barrier metal film.

5. A semiconductor apparatus manufactured by adoption of a manufacturing method including a process of:

forming a barrier metal film and carrying out physical etching making use of sputter gas to serve as a process to be carried out at the same time on wires connected to lower portions of first and second apertures created on a semiconductor substrate obtained by bonding first and second semiconductor substrates to each other to serve as first and second apertures having aspect ratios different from each other; and after forming a barrier metal layer and carrying out physical etching, carrying out a seed film formation process to form a seed layer on surfaces of the first and second apertures.

6. Electronic equipment comprising a semiconductor apparatus manufactured by adoption of a manufacturing method including a process of:

forming a barrier metal film and carrying out physical etching making use of sputter gas to serve as a process to be carried out at the same time on wires connected to lower portions of first and second apertures created on a semiconductor substrate obtained by bonding first and second semiconductor substrates to each other to serve as first and second apertures having aspect ratios different from each other; and after forming a barrier metal layer and carrying out physical etching, carrying out a seed film formation process to form a seed layer on surfaces of the first and second apertures.

* * * * *